United States Patent
Iwata et al.

[11] Patent Number: 5,943,282
[45] Date of Patent: Aug. 24, 1999

[54] SEMICONDUCTOR INTEGRATED CIRCUIT DEVICE, METHOD OF INVESTIGATING CAUSE OF FAILURE OCCURRING IN SEMICONDUCTOR INTEGRATED CIRCUIT DEVICE AND METHOD OF VERIFYING OPERATION OF SEMICONDUCTOR INTEGRATED CIRCUIT DEVICE

[75] Inventors: Yoshihisa Iwata, Yokohama; Hideko Oodaira, Tokyo, both of Japan

[73] Assignee: Kabushiki Kaisha Toshiba, Kanagawa-Ken, Japan

[21] Appl. No.: 09/079,397

[22] Filed: May 15, 1998

Related U.S. Application Data

[62] Division of application No. 08/706,434, Aug. 30, 1996.

[30] Foreign Application Priority Data

Aug. 31, 1995 [JP] Japan ................................. 7-224234

[51] Int. Cl.$^6$ .................................................. G11C 11/404
[52] U.S. Cl. .............................. 365/226; 365/204; 365/96
[58] Field of Search ......................... 365/185.01, 185.23, 365/226

[56] References Cited

U.S. PATENT DOCUMENTS

| | | | |
|---|---|---|---|
| 5,153,452 | 10/1992 | Iwamura et al. | 307/296.1 |
| 5,428,299 | 6/1995 | Koshikawa | 324/763 |
| 5,519,654 | 5/1996 | Kato et al. | 365/185.23 |

FOREIGN PATENT DOCUMENTS 405334873  12/1993  Japan .

*Primary Examiner*—Viet Q. Nguyen
*Attorney, Agent, or Firm*—Banner & Witcoff, Ltd.

[57] ABSTRACT

A NAND EEPROM is disclosed which is capable of variously setting, for each chip, the voltage to be applied to the control gates of memory cells. The semiconductor chip includes a NAND memory cell array and a high-voltage generating circuit for generating data writing internal voltage VPP required when data is written on the memory cell array. Moreover, the semiconductor chip includes a set voltage selection circuit for arbitrarily setting the level of the voltage VPP generated by the high-voltage generating circuit for each chip and a multiplexer for extracting, to the outside of the chip, setting signal LTF which is a signal for enabling the level of the voltage VPP set arbitrarily.

12 Claims, 27 Drawing Sheets

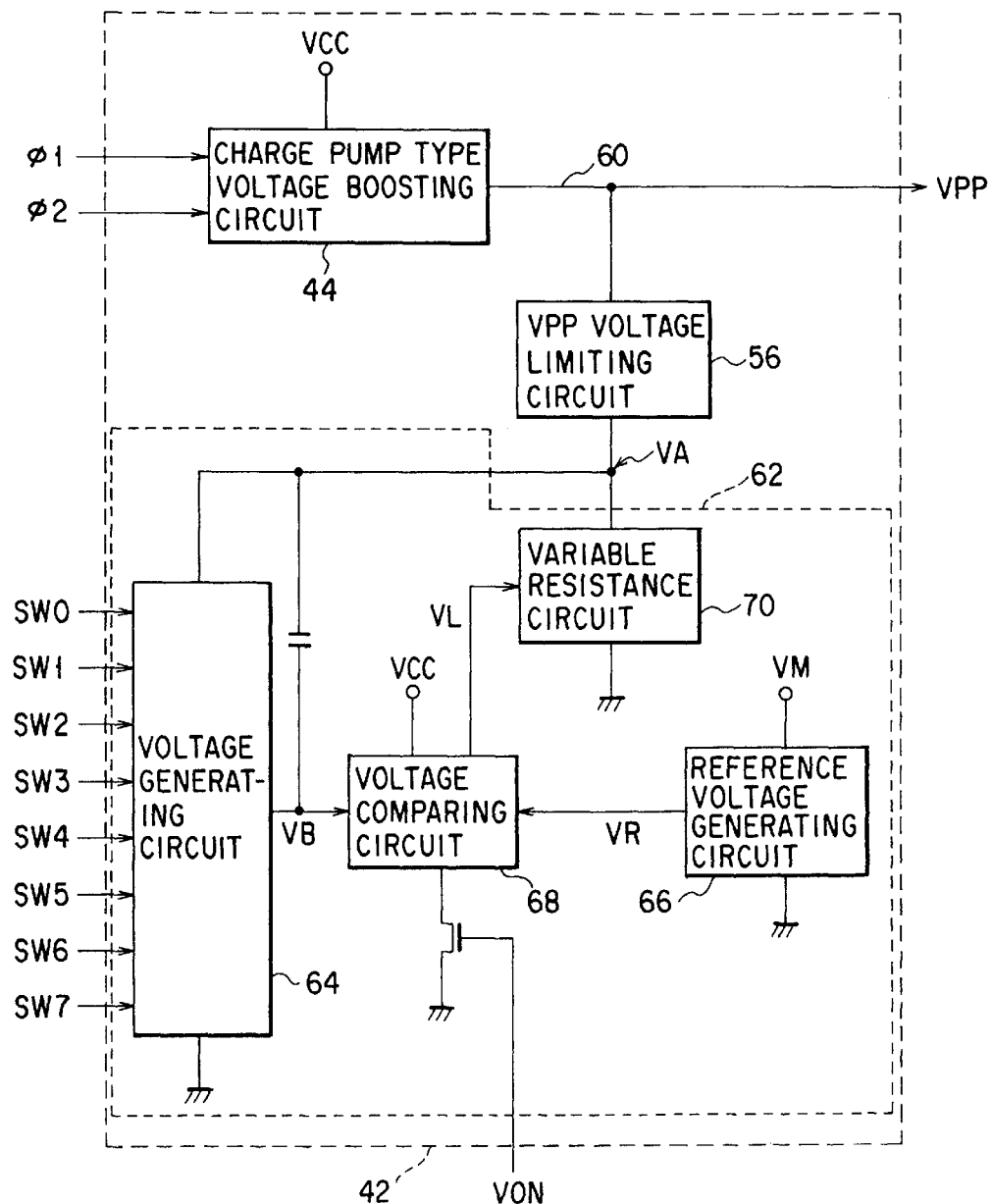
F I G. 3

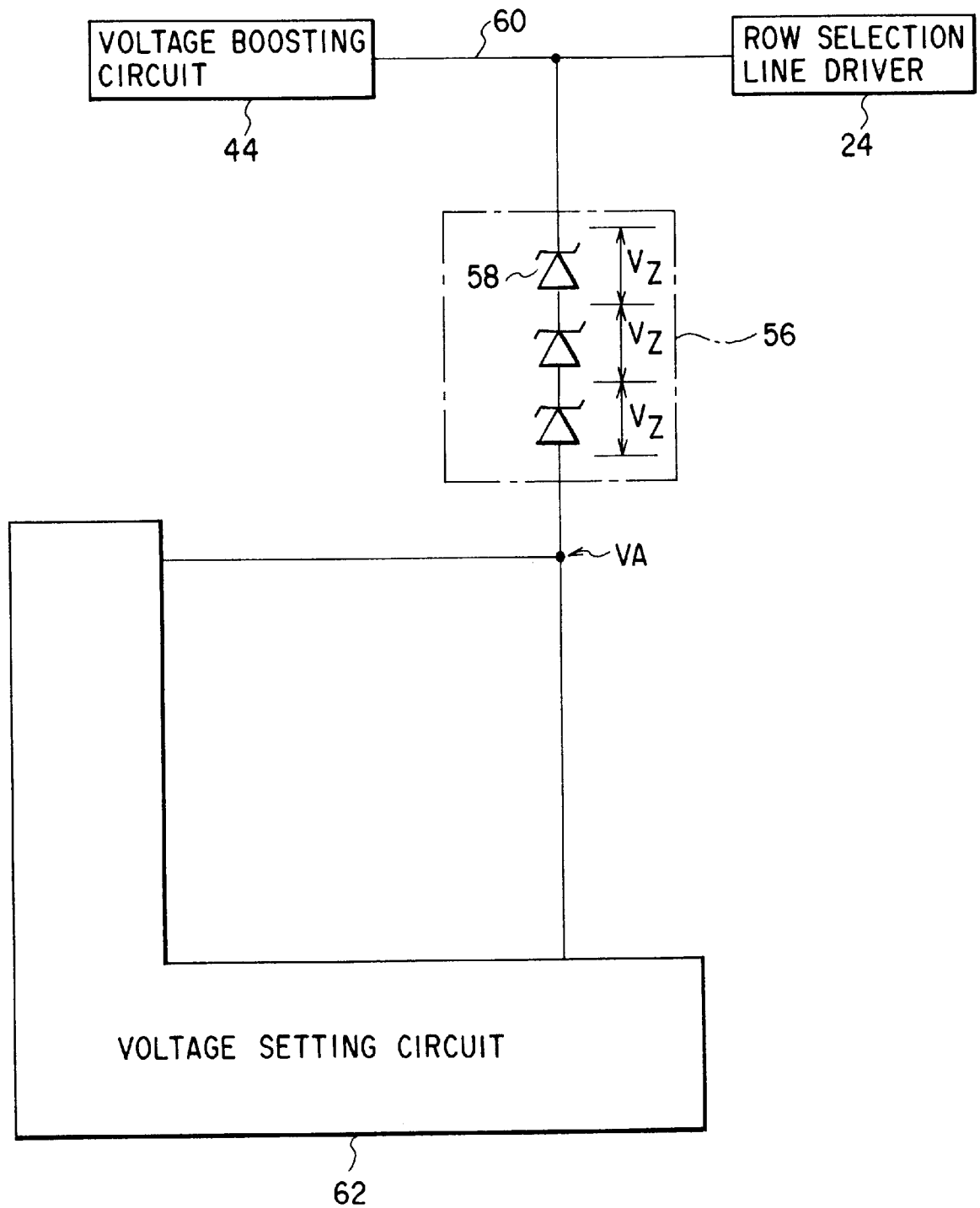
F I G. 6

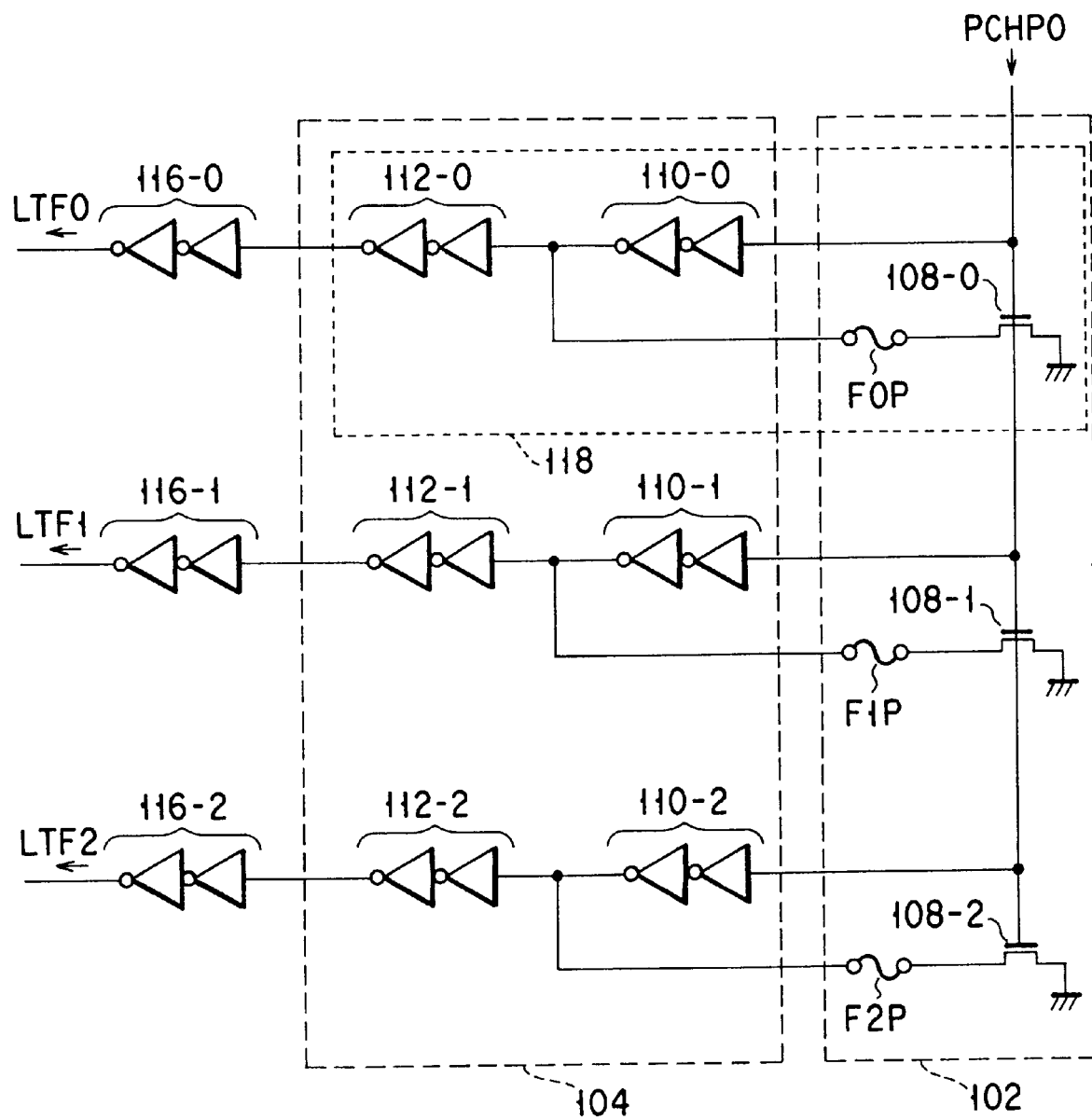
F I G. 8

| | FUSE | | | VALUE OF SETTING SIGNAL | | |
|---|---|---|---|---|---|---|
| | FOP | F1P | F2P | LTF0 | LTF1 | LTF2 |
| STATE 1 | CUT | NO CUT | NO CUT | H | L | L |
| STATE 2 | NO CUT | CUT | NO CUT | L | H | L |
| STATE 3 | CUT | CUT | NO CUT | H | H | L |
| STATE 4 | NO CUT | NO CUT | NO CUT | L | L | L |
| STATE 5 | NO CUT | NO CUT | CUT | L | L | H |
| STATE 6 | CUT | NO CUT | CUT | H | L | H |
| STATE 7 | NO CUT | CUT | CUT | L | H | H |
| STATE 8 | CUT | CUT | CUT | H | H | H |

VALUE INPUT TO DECODER (FOR SETTING VPP)
(ONLY ALL "H" CASE IS SHOWN)

| SETTING SIGNAL | DEC. 0 | | | DEC. 1 | | | DEC. 2 | | | DEC. 3 | | | DEC. 4 | | | DEC. 5 | | | DEC. 6 | | | DEC. 7 | | |
|---|---|---|---|---|---|---|---|---|---|---|---|---|---|---|---|---|---|---|---|---|---|---|---|---|
| | LTF0 | LTF1 | LTF2 | LTF0 | LTF1 | LTF2 | LTF0 | LTF1 | LTF2 | LTF0 | LTF1 | LTF2 | LTF0 | LTF1 | LTF2 | LTF0 | LTF1 | LTF2 | LTF0 | LTF1 | LTF2 | LTF0 | LTF1 | LTF2 |
| STATE 1 | H | H | H | | | | | | | | | | | | | | | | | | | | | |
| STATE 2 | | | | H | H | H | | | | | | | | | | | | | | | | | | |
| STATE 3 | | | | | | | H | H | H | | | | | | | | | | | | | | | |
| STATE 4 | | | | | | | | | | H | H | H | | | | | | | | | | | | |
| STATE 5 | | | | | | | | | | | | | H | H | H | | | | | | | | | |
| STATE 6 | | | | | | | | | | | | | | | | H | H | H | | | | | | |
| STATE 7 | | | | | | | | | | | | | | | | | | | H | H | H | | | |
| STATE 8 | | | | | | | | | | | | | | | | | | | | | | H | H | H |

| SWITCH SIGNAL | VALUE OUTPUT FROM DECODER ||||||||| SETTING VOLTAGE |
|---|---|---|---|---|---|---|---|---|---|
| | DEC.0 SW0 | DEC.1 SW1 | DEC.2 SW2 | DEC.3 SW3 | DEC.4 SW4 | DEC.5 SW5 | DEC.6 SW6 | DEC.7 SW7 | VPP |
| STATE 1 | H | | | | | | | | 17V |
| STATE 2 | | H | | | | | | | 18V |
| STATE 3 | | | H | | | | | | 19V |
| STATE 4 | | | | H | | | | | 20V |
| STATE 5 | | | | | H | | | | 21V |
| STATE 6 | | | | | | H | | | 22V |
| STATE 7 | | | | | | | H | | 23V |
| STATE 8 | | | | | | | | H | 24V |

(ONLY "H" CASE IS SHOWN)

FIG. 12

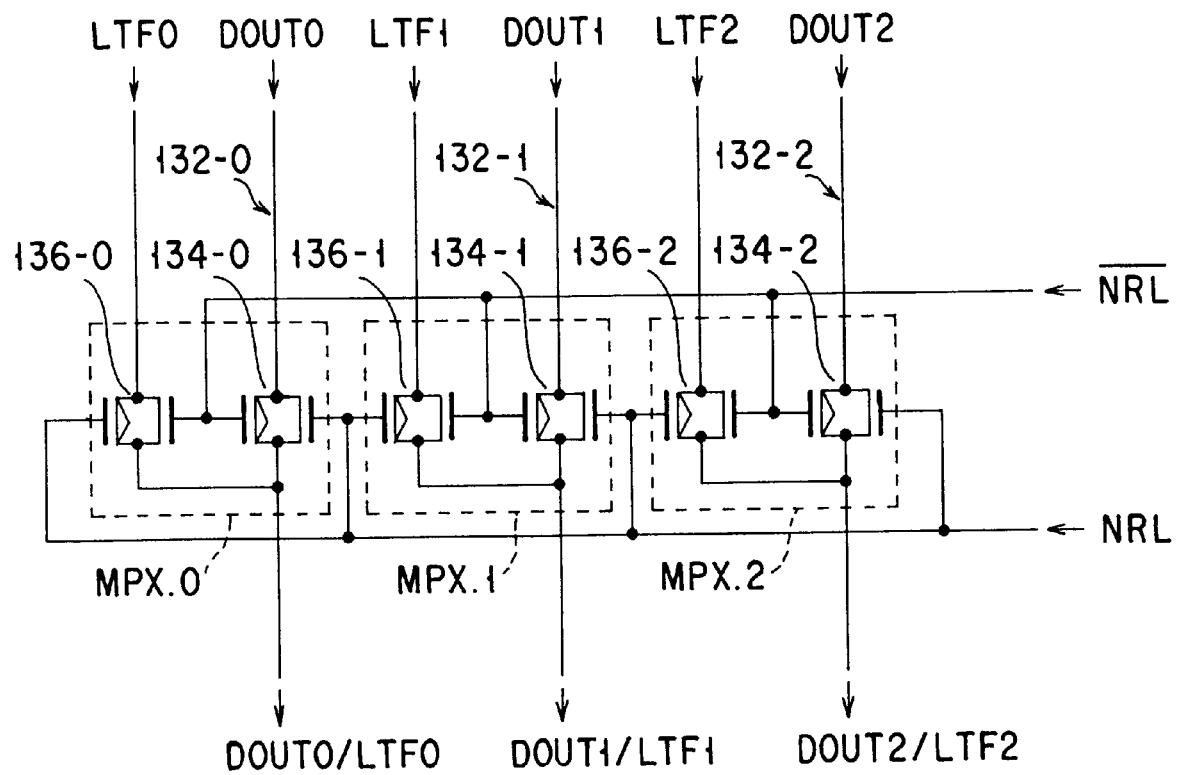
F I G. 14

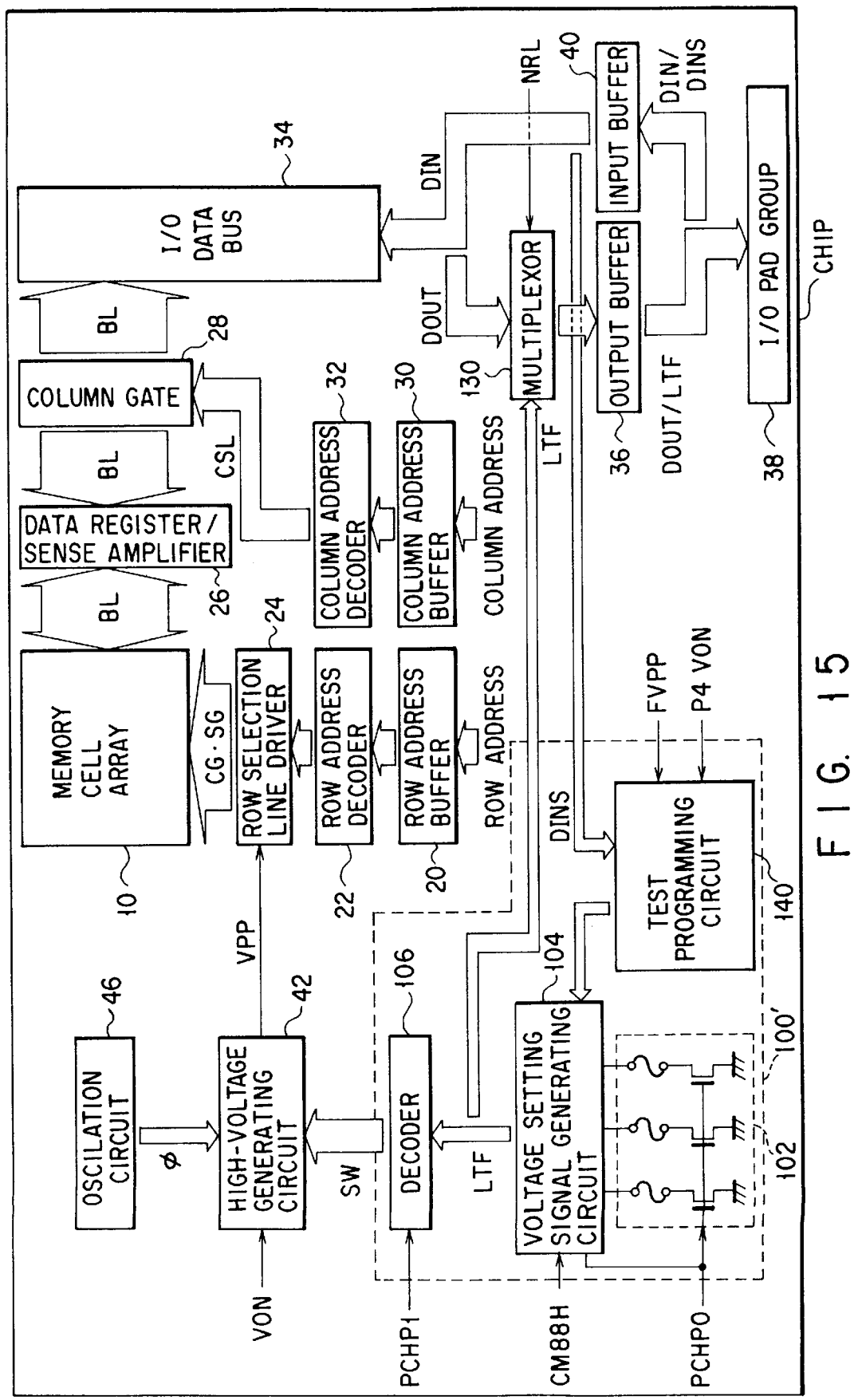
F I G. 15

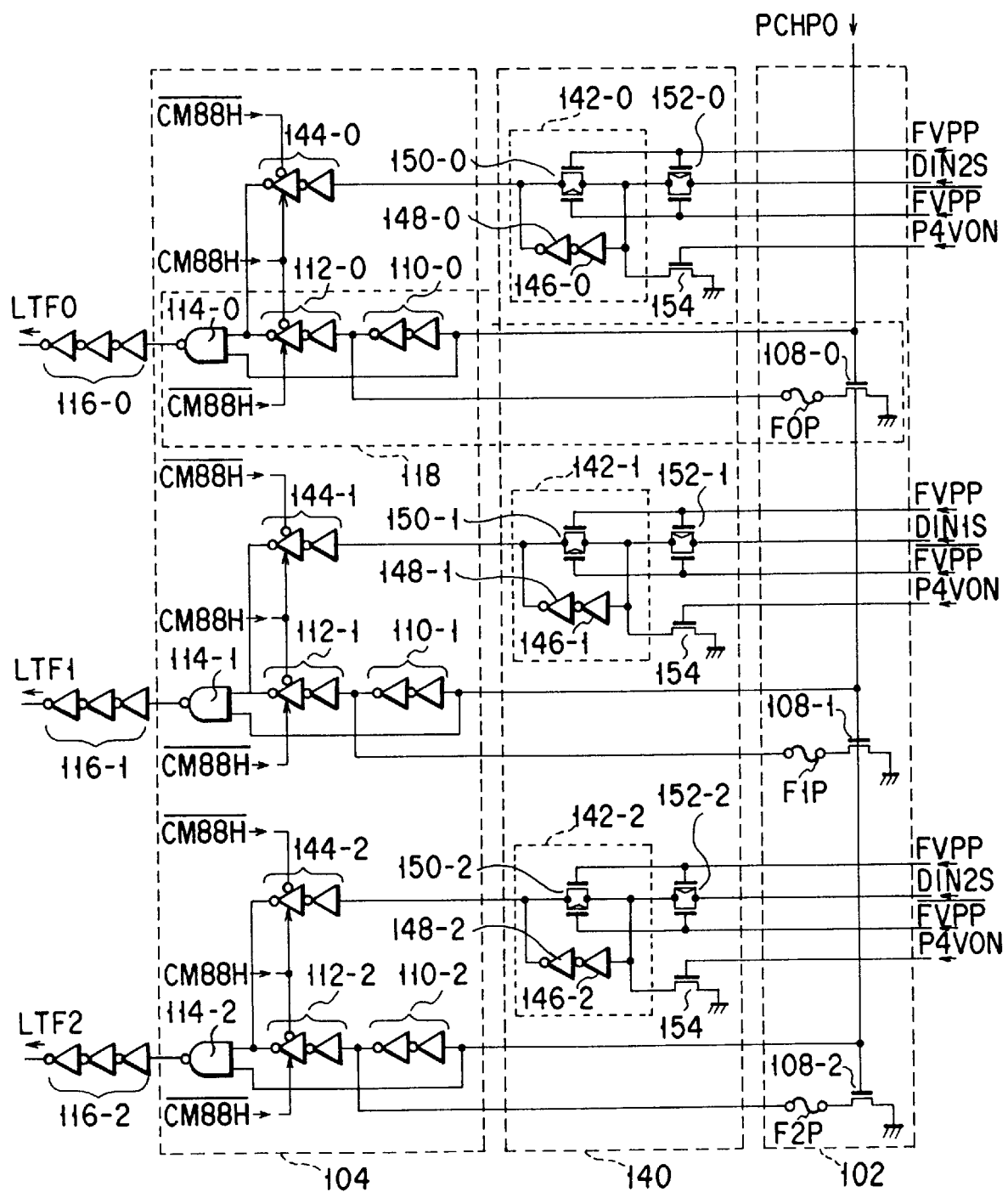
F I G. 16

|  | FUSE | | | VALUE OF SETTING SIGNAL | | |
| --- | --- | --- | --- | --- | --- | --- |
|  | F0E | F1E | F2E | LTF0 | LTF1 | LTF2 |
| STATE 1 | CUT | NO CUT | NO CUT | H | L | L |
| STATE 2 | NO CUT | CUT | NO CUT | L | H | L |
| STATE 3 | CUT | CUT | NO CUT | H | H | L |
| STATE 4 | NO CUT | NO CUT | CUT | L | L | H |
| STATE 5 | CUT | NO CUT | CUT | H | L | H |
| STATE 6 | NO CUT | CUT | CUT | L | H | H |
| STATE 7 | NO CUT | NO CUT | NO CUT | L | L | L |
| STATE 8 | CUT | CUT | CUT | H | H | H |

| SETTING SIGNAL | DEC. 0 | | | DEC. 1 | | | DEC. 2 | | | DEC. 3 | | | DEC. 4 | | | DEC. 5 | | | DEC. 6 | | | DEC. 7 | | |
|---|---|---|---|---|---|---|---|---|---|---|---|---|---|---|---|---|---|---|---|---|---|---|---|---|
| | LTF0 | LTF1 | LTF2 | LTF0 | LTF1 | LTF2 | LTF0 | LTF1 | LTF2 | LTF0 | LTF1 | LTF2 | LTF0 | LTF1 | LTF2 | LTF0 | LTF1 | LTF2 | LTF0 | LTF1 | LTF2 | LTF0 | LTF1 | LTF2 |
| STATE 1 | H | H | H | | | | | | | | | | | | | | | | | | | | | |
| STATE 2 | | | | H | H | H | | | | | | | | | | | | | | | | | | |
| STATE 3 | | | | | | | H | H | H | | | | | | | | | | | | | | | |
| STATE 4 | | | | | | | | | | H | H | H | | | | | | | | | | | | |
| STATE 5 | | | | | | | | | | | | | H | H | H | | | | | | | | | |
| STATE 6 | | | | | | | | | | | | | | | | H | H | H | | | | | | |
| STATE 7 | | | | | | | | | | | | | | | | | | | H | H | H | | | |
| STATE 8 | | | | | | | | | | | | | | | | | | | | | | H | H | H |

VALUE INPUT TO DECODER (FOR SETTING VEE)

(ONLY ALL "H" CASE IS SHOWN)

| SWITCH SIGNAL | VALUE OUTPUT FROM DECODER | | | | | | | | SETTING VOLTAGE |
|---|---|---|---|---|---|---|---|---|---|
| | DEC.0 | DEC.1 | DEC.2 | DEC.3 | DEC.4 | DEC.5 | DEC.6 | DEC.7 | |
| | SW0 | SW1 | SW2 | SW3 | SW4 | SW5 | SW6 | SW7 | VEE |
| STATE 1 | H | | | | | | | | 17V |
| STATE 2 | | H | | | | | | | 18V |
| STATE 3 | | | H | | | | | | 19V |
| STATE 4 | | | | H | | | | | 20V |
| STATE 5 | | | | | H | | | | 21V |
| STATE 6 | | | | | | H | | | 22V |
| STATE 7 | | | | | | | H | | 23V |
| STATE 8 | | | | | | | | H | 24V |

(ONLY "H" CASE IS SHOWN)

FIG. 24

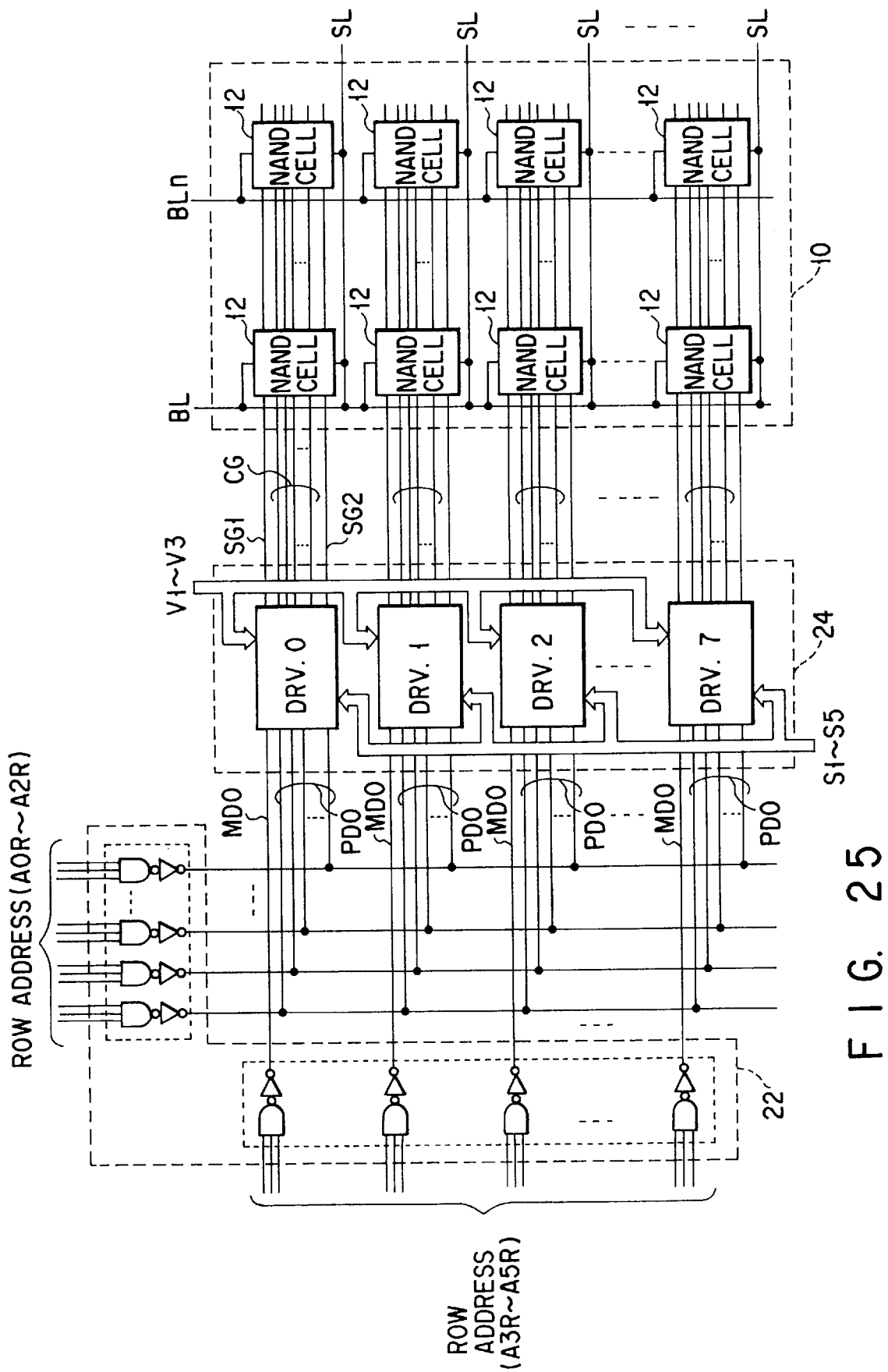
F I G. 25

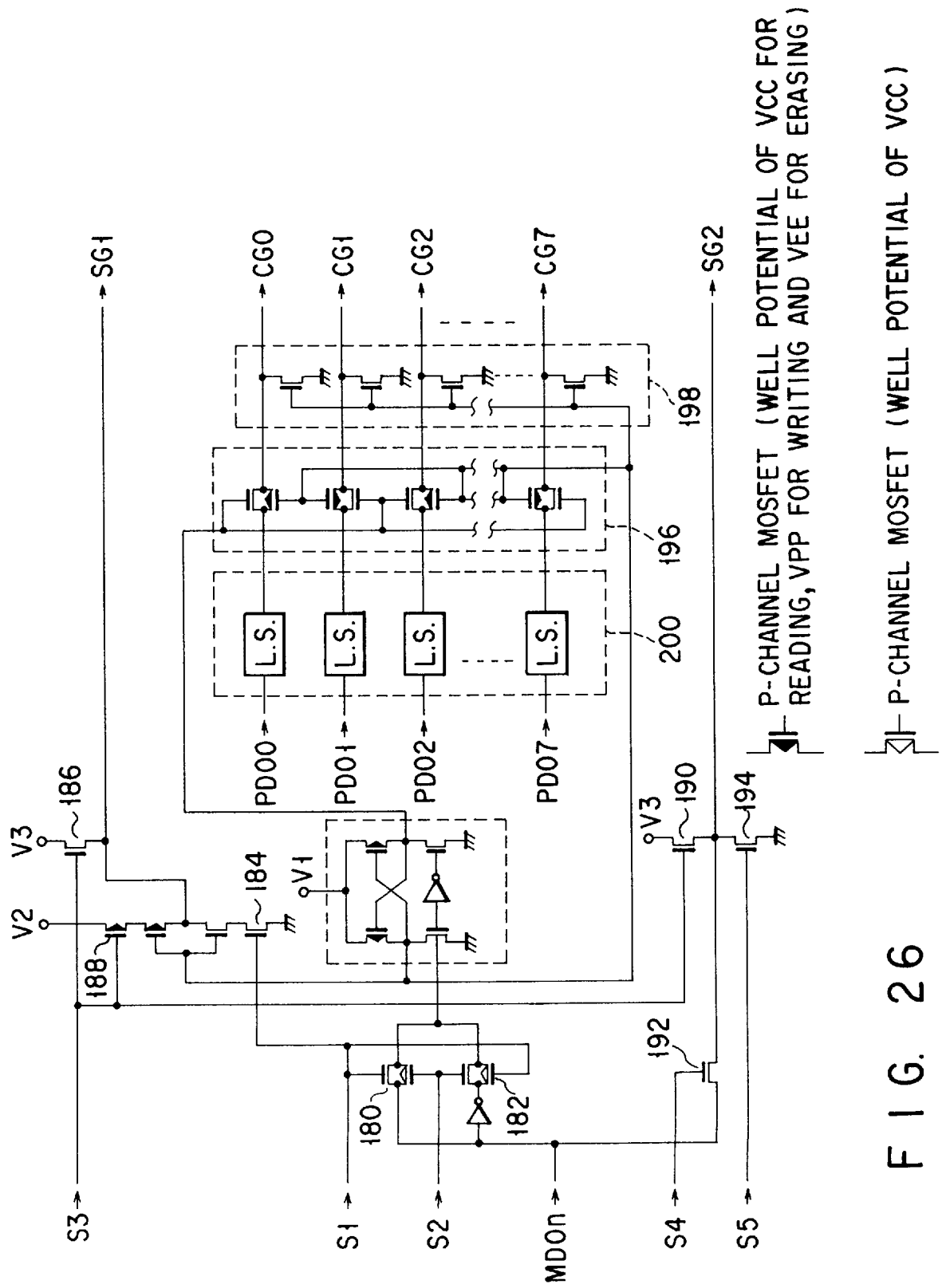
F I G. 26

|  | READ | WRITE | ERASE |
|---|---|---|---|
| CONTROL SIGNAL S1 | VCC | VCC | GND |
| CONTROL SIGNAL S2 | GND | GND | VCC |
| CONTROL SIGNAL S3 | GND | GND | VEE |
| CONTROL SIGNAL S4 | VCC | GND | GND |
| CONTROL SIGNAL S5 | GND | VCC | GND |
| POWER SOURCE V1 | VCC | VPP | VEE |
| POWER SOURCE V2 | VCC | VM | VCC |
| POWER SOURCE V3 | VCC | VCC | VEE |
| CG0~CG7 | SELECTION: GND / NON-SELECTION: VCC | SELECTION: VPP / NON-SELECTION: VM | SELECTION (HDO"H"): GND / NON-SELECTION (HDO"L"): VEE |

FIG. 27

SEMICONDUCTOR INTEGRATED CIRCUIT DEVICE, METHOD OF INVESTIGATING CAUSE OF FAILURE OCCURRING IN SEMICONDUCTOR INTEGRATED CIRCUIT DEVICE AND METHOD OF VERIFYING OPERATION OF SEMICONDUCTOR INTEGRATED CIRCUIT DEVICE

This application is a division of Ser. No. 08/706,434 filed Aug. 30, 1996.

BACKGROUND OF THE INVENTION

1. Field of the Invention

The present invention relates to a semiconductor integrated circuit device having, in a semiconductor chip thereof, a voltage generating circuit for generating an operation voltage required for an integrated circuit thereof, a method of investigating a cause of a failure if the failure takes place in the semiconductor integrated circuit device, and a method of verifying the operation of the semiconductor integrated circuit device.

2. Description of the Related Art

An EEPROM, which is one type of non-volatile memory, permits data to be electrically written thereto and data to be electrically erased therefrom. A portion of EEPROM, for example, an EEPROM called NAND EEPROM, uses a tunnel current when data is electrically written or erased. The NAND EEPROM has a plurality of memory cells (hereinafter called "cells") serially connected between bit lines and the ground lines. A portion of the NAND EEPROM comprises, in the chip thereof, a voltage generating circuit for generating writing/erasing voltage, the level of which is higher than the power supply voltage. The NAND EEPROM can be operated by only supplying one type of power supply voltage.

FIGS. 28A to 28C show a cell of the NAND EEPROM. FIG. 28A is a plane view, FIG. 28B is a cross-sectional view taken along line B—B shown in FIG. 28A, and FIG. 28C is a cross-sectional view taken along line C—C shown in FIG. 28A.

FIG. 28A shows two cells, in series, connected to each other. Then, the structure of the cell will now be described while paying attention to one of the two cells.

As shown in FIGS. 28A to 28C, an N-type silicon substrate 1 includes a P⁻ type well 2 formed therein. The well 2 includes a plurality of N⁺ type diffusion layers 3 formed therein. The N⁺ type diffusion layers 3 serve as sources and drains of the cell. A portion of the substrate 1 between the N⁺ type diffusion layers 3 is used as a channel region 4. On the channel region 4, there is formed a gate oxide film (SiO₂) 5. Note that a thick silicon dioxide film (SiO₂) 6 formed on the well 2 is a field insulating film for separating the cells from one another. The field insulating film 6 is formed by LOCOS (Localized Oxidation of Silicon). A floating gate 7 is formed on the top surface of the gate oxide film 5 to the field insulating film 6. The floating gate 7 is made of electrically conductive polysilicon. The floating gate 7 is a charge storage layer for enabling the threshold of the cell to be variable. Therefore, the floating gate 7 is formed for each cell. On the floating gate 7, there is formed a control gate 9 through an interlayer insulating film (SiO₂). The control gate 9 is made of electrically conductive polysilicon. The control gate 9 serves as a word line.

The method for writing data "0" in the cell will now be described.

The well 2 and the N⁺ type diffusion layers 3 respectively are grounded, and then program potential VPP (about 20V) is applied to the control gate 9. As a result, the control gate 9 and the floating gate 7 are capacity-coupled to each other so that the potential of the floating gate 7 is raised. The conduction type of the channel region 4 is reversed from P type to N type. The N-type channel region 4 is connected to the N-type diffusion layer 3. The potential of the channel region 4 is made to be the ground potential. Thus, the potential difference takes place between the channel region 4, which has been made to be the ground potential, and the floating gate 7. Therefore, a tunnel current flows from the floating gate 7 to the channel region 4 (and the N⁺ type diffusion layers 3). When the tunnel current has been allowed to flow, electrons are injected into the floating gate 7. The floating gate 7, into which electrons have been injected, is negatively charged. When the floating gate 7 has been negatively charged, the threshold of the cell is raised. When the threshold of the cell has been raised, the cell is turned off when data is read out. The foregoing state is a state in which data "0" has been written. When data is read out, the state in which the cell has been turned on, is a state in which data "1" has been written. In this specification, the method of writing data "1" is omitted from description.

The magnitude of the tunnel current depends upon the level of the potential between the floating gate 7 and the channel region 4. Since change in the magnitude of the tunnel current causes the amount of electrons to be injected into the floating gate 7 to be changed, the amount of charge of the floating gate 7 is changed. That is, even if the same program potential VPP is applied to the control gate 9, change in the intensity of the electric field E results in the threshold of the cell being changed.

The electric field E is represented by the following equation:

$$E = \{C_{CF}/(C_{CF}+C_{FS})\} \times (1/t_{GAOX}) \times V \quad (1)$$

wherein $C_{CF}$ is the capacity of a capacitor between the control gate 9 and the floating gate 7, $C_{FS}$ is the capacity of the capacitor between the control gate 9 and the channel region 4, $t_{GAOX}$ is the thickness of the gate oxide film 5 and V is the voltage to be applied to the control gate 9.

An assumption is performed that a capacitor having capacity $C_{CF}$ and a capacitor having capacity $C_{FS}$ are parallel-plate type capacitors respectively having areas $S_{CF}$ and $S_{FS}$. Moreover, thickness of the interlayer insulating film 8 is assumed to be $t_{INTER}$.

Assuming that the gate oxide film 5 and the interlayer insulating film 8 are made of the same material (SiO₂) having the same dielectric constant, the foregoing Equation (1) can be converted into the following equation:

$$E = (V/t_{GAOX}) \times [1/\{1+(S_{FS}/S_{CF}) \times (t_{INTER}/t_{GAOX})\}] \quad (2)$$

As can be understood from Equation (2), the electric field E is in inverse proportion to the thickness $t_{GAOX}$ and the area $S_{FS}$. The area $S_{FS}$ is determined by gate width W shown in FIG. 28B and gate length L shown in FIG. 28C.

The thickness $t_{GAOX}$ of the gate oxide film 5 is determined in an oxidizing process for forming the gate oxide film 5. The gate length L is determined in a lithography process for patterning the control gate 9 and the floating gate 7. That is, each of the thickness $t_{GAOX}$, the gate width W and the gate length L unintentionally contains dispersion (dispersion occurring during the manufacturing process) from a designed value. Since each of the thickness $t_{GAOX}$, the gate width W and the gate length L contains dispersion from the designed value as described above, the electric field E cannot be constant for all chips.

However, since the voltage V is fixed for all chips, the quantity of electrons to be injected into the floating gate 7 is dispersed for each chip.

The dispersion becomes greatest for each manufacturing lot because the same manufacturing conditions cannot be allowed to reappear for all lots even if the manufacturing process is performed on the same manufacturing line.

SUMMARY OF THE INVENTION

To prevent dispersion in the quantity of electrons to be injected into the floating gate 7, it might be considered feasible to employ a contrivance with which the voltage to be applied to the control gate 9 is made to be variable for each chip. The voltage to be applied to the control gate 9 is set by using a fuse. However, the method of setting the voltage by using the fuse cannot enable the set voltage level to easily be known after the semiconductor integrated circuit device has been packaged. To detect the set voltage level, the package is needed to be decomposed to take out the chip, followed by decomposing the chip to visually confirm whether the fuse has been disconnected.

If the integrated circuit device encounters a failure, investigation of the cause of the failure is a critical fact to significantly improve the reliability of the products and manufacturing yield of the same.

The causes of failures experienced with the integrated circuit device have not been limited to simple causes, such as short circuit and breakdown, as the structure of the integrated circuit device has been complicated. For example, the causes are exemplified by interference of circuits and a peculiar phenomenon occurring during the operation of the circuit, each of which cannot be expected at the time of designing the integrated circuit device.

Although the chip is, as a matter of course, decomposed to investigate the cause of the failure, the decomposition results in the device to be broken and, therefore, it cannot be operated anymore. Thus, interference of circuits and a peculiar phenomenon occurring during the operation of the circuit, each of which cannot be expected cannot be investigated.

In view of the foregoing, a first object of the present invention is to provide a semiconductor integrated circuit device capable of detecting a set internal voltage level without a necessity of decomposing the package and the chip even after the chip has been packaged and a method of investigating the cause of a failure in a semiconductor integrated circuit device using the foregoing semiconductor integrated circuit device.

A second object of the present invention is to provide a semiconductor integrated circuit device capable of previously verifying the operation of an integrated circuit at each set internal voltage level and a method of verifying the operation of a semiconductor integrated circuit device using the semiconductor integrated circuit device.

A third object of the present invention is to provide a semiconductor integrated circuit device having a circuit for setting the internal voltage level to be any one of variable levels, capable of minimizing the size of the circuit and thus having a small area.

To achieve the first object, a semiconductor integrated circuit device according to the present invention comprising: a semiconductor chip; an integrated circuit provided in the chip; an internal voltage generating circuit for generating an internal voltage used in the integrated circuit; an internal voltage setting circuit for setting a level of the internal voltage; and a level-setting information extracting circuit for extracting a level-setting information from the internal voltage setting circuit to the outside of the chip.

To achieve the second object, a semiconductor integrated circuit device according to the present invention comprising: a semiconductor chip; an integrated circuit provided in the chip; an internal voltage generating circuit for generating an internal voltage used in the integrated circuit; an internal voltage setting circuit for setting a level of the internal voltage; a determining circuit for determining the level of the internal voltage; and a changing circuit for changing the level of the internal voltage before the determining circuit determines the level of the internal voltage.

To achieve the third object, a semiconductor integrated circuit device according to the present invention comprising: a semiconductor chip; an integrated circuit provided in the chip; an internal voltage generating circuit for generating first and second internal voltages used in the integrated circuit; a first internal voltage setting circuit for setting a level of the first internal voltage; and a second internal voltage setting circuit for setting a level of the second internal voltage.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 3 is a block diagram showing a high-voltage generating circuit;

FIG. 6 is a circuit diagram showing a voltage limiting circuit;

FIG. 8 is a circuit diagram showing a programming circuit and voltage setting signal generating circuit;

FIG. 10 is a diagram showing the relationship between states of fuses and the levels of setting signals;

FIG. 11 is a diagram showing the relationship between the states of the fuse and values input to the decoder;

FIG. 12 is a diagram showing the relationship between the states of the fuse and values output from the decoder;

FIG. 14 is a circuit diagram showing the multiplexer;

FIG. 15 is a block diagram showing a NAND EEPROM according to a second embodiment of the present invention;

FIG. 16 is a circuit diagram showing a programming circuit, a voltage setting signal generating circuit and programming circuit for a test;

FIG. 22 is a diagram showing the relationship between the states of the fuse and the levels of the setting signal;

FIG. 23 is a diagram showing the relationship between the states of the fuse and input values to the decoder;

FIG. 24 is a diagram showing the relationship between the states of the fuse and output values from the decoder;

FIG. 25 is a block diagram showing a row address decoder, a row selection line driver and a memory cell array 10;

FIG. 26 is a circuit diagram showing an operation circuit;

FIG. 27 is a diagram showing the power supply voltage levels V1 to V3 and levels of control signals S1 to S5;

DETAILED DESCRIPTION OF THE PREFERRED EMBODIMENTS

Figure 1:
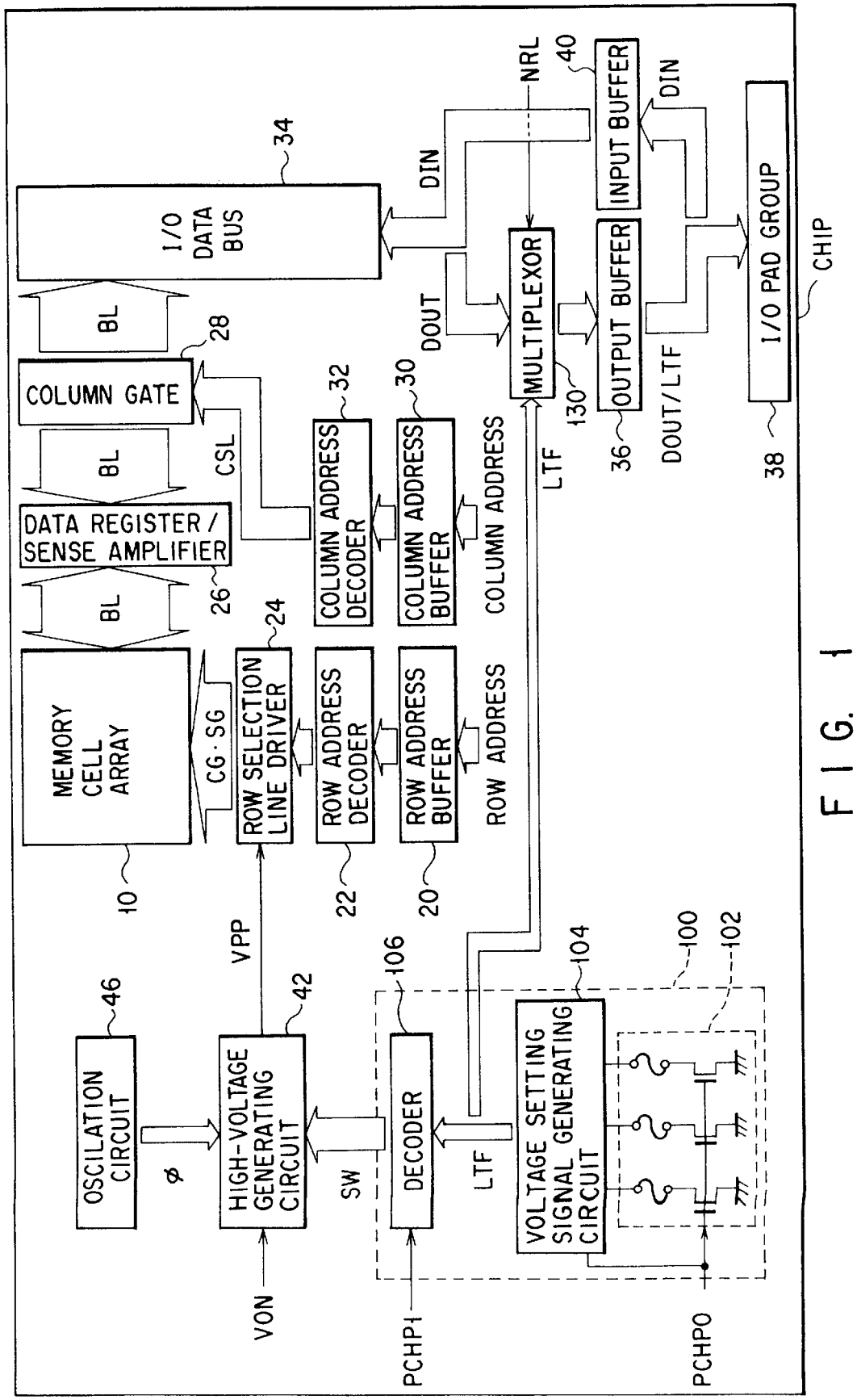
FIG. 1 is a block diagram showing a NAND EEPROM according to a first embodiment of the present invention.

Preferred embodiments of the present invention will now be described. The description will be made below such that the same elements are given the same reference numerals and the same elements are omitted from the description to prevent overlap.

Figure 2:
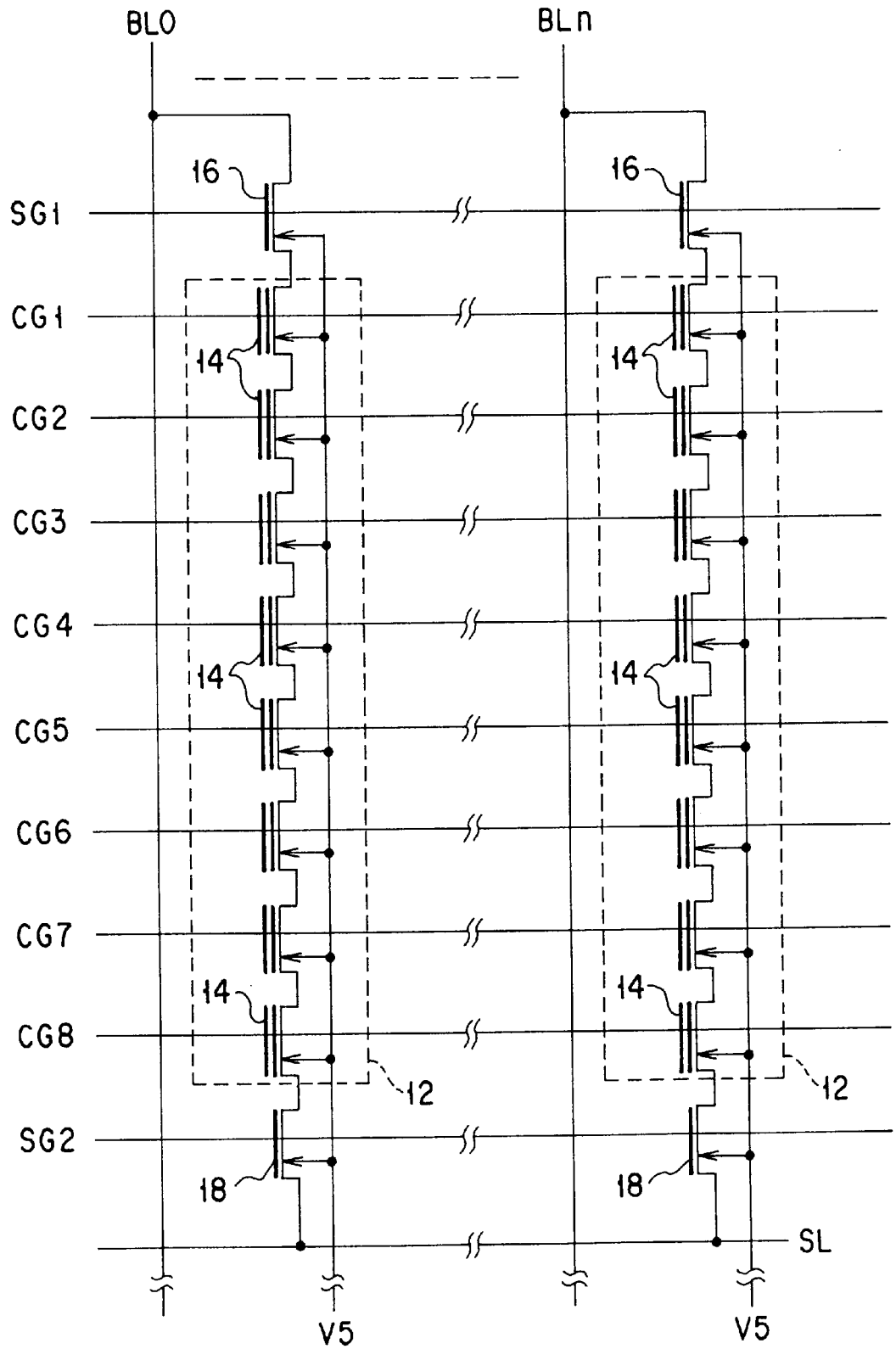
FIG. 2 is a circuit diagram showing a NAND EEPROM cell.

FIG. 1 is a block diagram showing a NAND EEPROM according to a first embodiment of the present invention. FIG. 2 is a circuit diagram showing the NAND EEPROM cell.

As shown in FIG. 1, a memory array 10 serving as a circuit for storing data is disposed in an integrated circuit chip. The memory array cell 10 has NAND EEPROM cells shown in FIG. 2 and formed into a matrix configuration. The NAND type cell 12 includes EEPROM cells 14 connected serially. The EEPROM cell 14 basically is an insulating gate type FET and has a characteristic that it has a floating gate serving as a charge storage portion in a gate insulating film thereof. The EEPROM cell 14 is able to change the threshold of the insulating gate type FET by negatively (or positively) charging the floating gate. Since the threshold can be changed, the EEPROM cell 14 is able to store data "0" or "1". One of methods for negatively charging the floating gate is to inject electrons into the floating gate. The state where the floating gate has been negatively changed is a state where data "0" has been stored. To erase data "0", electrons are required to be removed from the floating gate. Thus, the stored data is converted from "0" to "1" so that data "0" is erased.

The gate of the EEPROM cell 14 is connected to a control gate line (CG1 to CG8) which is one of row selection lines. An end of a current pass of the NAND type cell 12 is, through a selection gate 16, connected to a bit line (BL0 to BLn), and another end of the same is, through a selection gate 18, connected to a source line (SL). The gate of the selection gate 16 is connected to a first selection gate line (SG1) which is one of the row selection lines, while the gate of the selection gate 18 is connected to a second selection gate line (SG2) which is the other of the row selection lines.

A circuit for operating the NAND EEPROM shown in FIG. 1 will now be described together with the description of the operation of the circuit to be performed when data is read.

As shown in FIG. 1, the row selection lines (CG and SG) are selected by using row address. The row address is input to a row address decoder 22 through a row address buffer 20 so as to be decoded. Row selection lines among an extensive number of the row selection lines that correspond to a result of the decoding operations are activated. The activated row selection lines are applied with predetermined internal voltage by a row selection line driver 24. The row selection lines applied with the predetermined internal voltage select rows in the memory cell array 10.

Data "0" or "1" is, to bit lines (BL0 to BLn), read from the NAND type cell 12 and the EEPROM cell 14 corresponding to the selected rows. Data read to the bit line is stored/amplified by a data register/sense amplifier 26. The data register/sense amplifier 26 is connected to a column gate 28. A column selection line (CSL) is connected to the column gate 28 so that a column selection signal is supplied.

The column selection line (CSL) is selected by using column address. The column address is supplied to a column address decoder 32 through a column address buffer 30 so as to be decoded. Among an extensive number of column selection lines, column selection lines corresponding to a result of the decoding operation are selected and activated. The activated column selection lines supply column selection signals to the column gate 28. The column gate 28 supplied with the column selection signal causes data register/sense amplifier 26 to be connected to an I/O data bus 34.

Thus, selection of the rows and columns, from which data are needed to be read, from the memory cell array 10 having the cell blocks 14 arranged into the matrix configuration has been completed. Since the rows and columns have been selected, cells 14 among the extensive number of cells 14 to which access are needed to be made are determined. Then, data "0" or "1" stored in the cells 14 is read from the cells 14 determined to be accessed so as to be read to an I/O data bus 34.

Data (DOUT) read to the I/O data bus 34 is, through an output buffer 36, supplied to an I/O pad group 38. I/O pads provided for the I/O pad group 38 are junctions between the integrated circuit chip and the outside. Lead terminals of the integrated circuit device are connected to the I/O pads. Data (DOUT) supplied to the I/O pad is supplied to lead lines (not shown) so as to be transmitted to the outside of the semiconductor circuit chip. Then, the operation of writing data on the NAND EEPROM according to the first embodiment will now be described.

The NAND EEPROM shown in FIG. 1 has functions with which data can be written thereto, all of written data items can collectively be erased therefrom, a portion of written data can be erased therefrom and new data can be written to an area from which stored data has been erased.

When data is written, data (DIN) to be written, is supplied from a lead terminal (not shown) to the I/O pad. Data supplied to the I/O pad is, through an input buffer 40, transferred to the I/O data bus 34. Data supplied to the I/O data bus 34 is supplied to the data register/sense amplifier 26.

In order to supply data to the data register/sense amplifier 26 in the column to which data is intended to be written, column selection lines among extensive number of column selection lines (CSL) that are needed to be activated are selected by using the column address similarly to the reading process.

The activated column selection lines supply column selection signals to the column gate 28. The column gate 28 supplied with the column selection signals causes the bit line to be connected to the data register/sense amplifier 26.

Data supplied to the data register/sense amplifier 26 through the column gate 28 is stored/amplified by the data register/sense amplifier 26.

In order to select rows, to which data is to be written, after data has been stored/amplified by the data register/sense amplifier 26, row selection lines, to be activated, are selected from extensive number of row selection lines (CG and SG) by using row address similarly to the reading process. Among the selected row selection lines, the control gate line (CG) to be connected to the gate of the cell 14 is applied with internal voltage VPP for writing data by the row selection line driver 24, the internal voltage VPP for writing data being higher than power supply voltage VCC.

Thus, selection of columns and rows, to which data is needed to be written, from the memory cell array 10 having the cell blocks 14 formed into the matrix configuration is completed. Since the rows and columns have been selected as described above, cells 14, to which data is needed to be written, are determined among the extensive number of the cells 14. Thus, data is written on the determined cells 14.

Then, the circuit for generating the internal voltage VPP for writing data will now be described together with the operation for generating the voltage.

As shown in FIG. 1, the internal voltage VPP for writing data is generated by a high-voltage generating circuit 42.

FIG. 3 is a block diagram showing the high-voltage generating circuit 42 shown in FIG. 1.

As shown in FIG. 3, the high-voltage generating circuit 42 includes a charge pump type voltage boosting circuit 44 serving as a booster. The voltage boosting circuit 44 raises power supply voltage VCC (about 3.3V) by using voltage raising clocks ø1 and ø2. The voltage raising clocks ø1 and ø2 are generated by an oscillation circuit 46, such as a ring oscillator.

Figure 4:
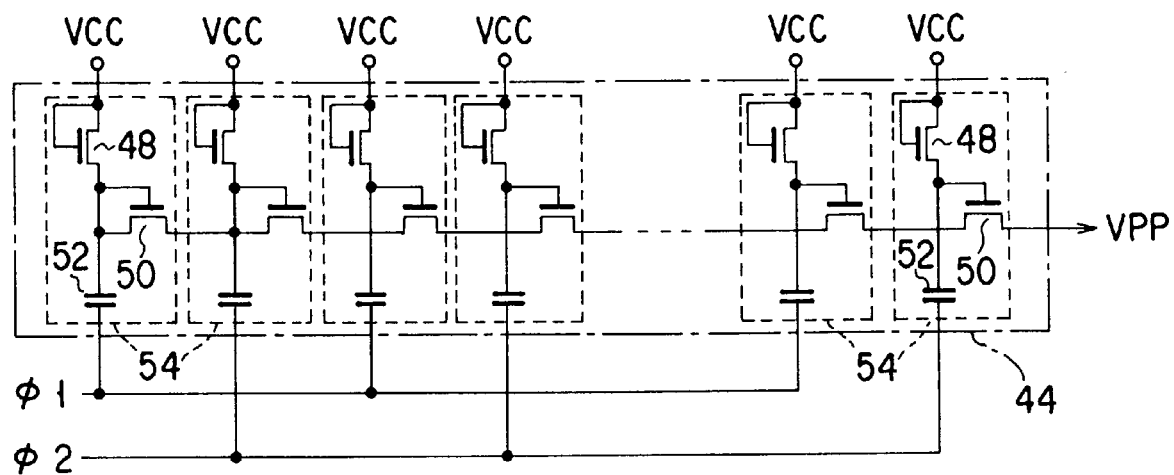
FIG. 4 is a circuit diagram showing a voltage boosting circuit.
Figure 5:
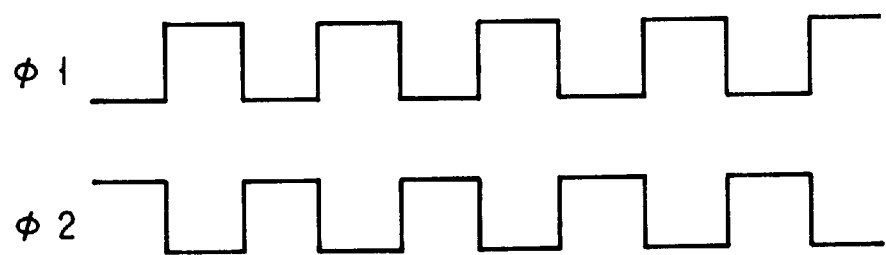
FIG. 5 is a waveform diagram showing voltage raising clocks.

FIG. 4 is a circuit diagram showing the voltage boosting circuit 44 shown in FIG. 3, and FIG. 5 is a waveform graph showing the voltage raising clocks ø1 and ø2.

As shown in FIG. 4, the voltage boosting circuit 44 comprises a plurality of charge pump circuits 54 each consisting of a MOSFET 48 supplied with the power supply voltage VCC at an end of the current passage and the gate thereof, a MOSFET 50 having an end of the current passage and the gate connected to another end of the current passage of the MOSFET 48 and a capacitor 52 having an electrode connected to an end of the current passage of the MOSFET 50. The charge pump circuits 54 are connected successively by connecting the other end of the current passage of the MOSFET 50 to an end of the current passage of the next MOSFET 50. The capacitor 52 has another electrode which is alternately supplied with the two-phase voltage raising clocks ø1 and ø2. Thus, voltage raised from the power supply voltage, that is, the internal voltage VPP for writing data, is obtained at an end of the current passage of the final MOSFET 50. The internal voltage VPP for writing data generated by the voltage boosting circuit 44 is, as shown in FIG. 1, limited to a predetermined value by using a VPP voltage limiting circuit 56.

FIG. 6 is a circuit diagram showing the VPP voltage limiting circuit 56 shown in FIG. 3.

As shown in FIG. 6, the VPP voltage limiting circuit 56 includes a plurality of Zener diodes 58 connected in series. The cathode side end of the Zener diodes 58 connected in series is connected to a internal voltage line 60 for writing data. The internal voltage line 60 for writing data establishes the connection between the voltage boosting circuit 44 and the row selection line driver 24. The anode side end of the Zener diodes 58 connected in series is connected to a point to which voltage VA determined by a voltage setting circuit 62 is supplied.

Three Zener diodes 58, connected in series, are provided in this embodiment. Zener breakdown voltage Vz of each of Zener diodes 58 is set to 5V. Therefore, the Zener breakdown voltage Vz in the VPP voltage limiting circuit 56 is 15V. The internal voltage VPP for writing data generated by the voltage boosting circuit 44 is, by the VPP voltage limiting circuit 56, limited to the sum of the Zener breakdown voltage Vz and the voltage VA, that is, 15V+VA.

The voltage setting circuit 62 for setting the voltage VA to be supplied to the anode side end of the Zener diodes 58, as shown in FIG. 3, includes a voltage generating circuit 64, a reference voltage generating circuit 66, a voltage comparing circuit 68 and a variable resistance circuit 70.

Figure 7:
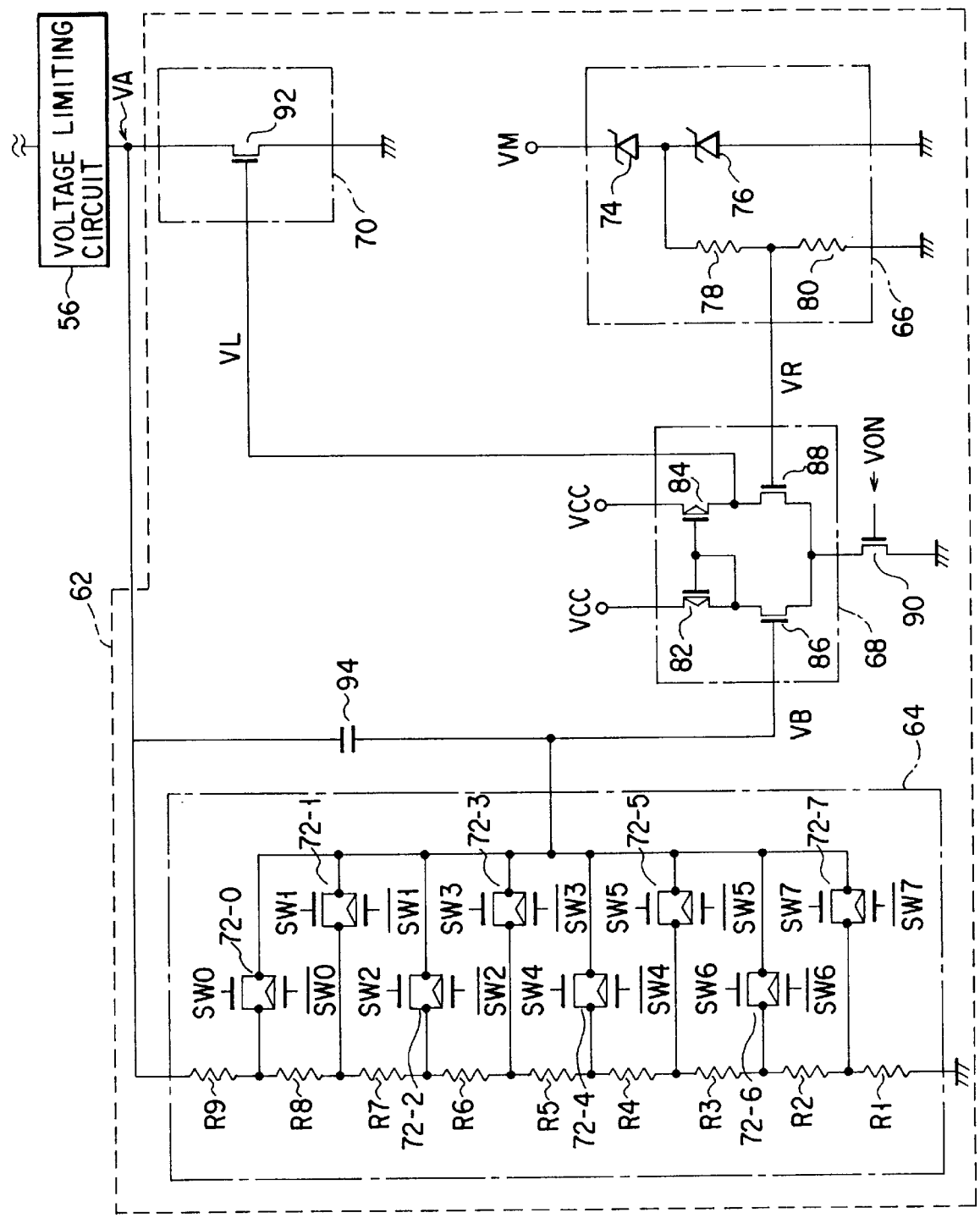
FIG. 7 is a circuit diagram showing a voltage setting circuit.

FIG. 7 is a circuit diagram showing the voltage setting circuit 62 shown in FIG. 3.

Then, the description will initially be made about the voltage generating circuit 64.

As shown in FIG. 7, the voltage generating circuit 64 includes nine voltage dividing resistors R1 to R9, in series, connected to a position between the anode side end of the VPP voltage limiting circuit 56 and the ground point and eight CMOS type transfer gates 72-0 to 72-7, an end of the current passage of each of which is connected to a series connection point of the resistor R1 to R9 and other ends of the current passages of which are commonly connected. The gate of the N channel MOSFET and the gate of the P channel MOSFET of the eight transfer gates 72-0 to 72-7 are supplied with pairs of switch signals SW0 and /SW0 (/ given to the leading end means a reverse signal) to SW7 and /SW7 which correspond to each other and are complementary.

The voltage generating circuit 64 divides the voltage between the potential of the anode side end of the VPP voltage limiting circuit 56 and the ground into 8 levels by the resistors R1 to R9. By using the switch signals SW0 to SW7 to make any one of the eight transfer gates 72-0 to 72-7 to be conductive, any one of the eight voltages provided by the division above can be selected. As a result, the voltage VB of the end of the transfer gates 72-0 to 72-7 connected commonly can be set to any one of the eight levels. By making any one of the transfer gates 72-0 to 72-7 to be conductive, any one of the eight levels of the voltage VB can be selected.

The reference voltage generating circuit 66 includes two Zener diodes 74 and 76, in series, connected to positions between the end, at which the intermediate potential VM is supplied, and the ground and two resistors 78 and 80, in series, connected between the connection point, at which the Zener diodes 74 and 76 are connected to each other, and the ground.

The reference voltage generating circuit 66 divides the potential difference between intermediate potential VM and the ground into two levels by Zener diodes 74 and 76. Moreover, the reference voltage generating circuit 66 divides the potential difference between the two levels, realized by the division, and the ground in accordance with the resistance ratio of the resistors 78 and 80 so that stable reference voltage VR is generated.

The voltage comparing circuit 68 is a differential calculation amplifying circuit including P channel MOSFETs 82 and 84 and N channel MOSFETs 86 and 88 for operation. The gate of the N channel MOSFET 86 for operation is supplied with the voltage VB selected by the voltage generating circuit 64, while the gate of the N channel MOSFET 88 is supplied with the reference voltage VR generated by the reference voltage generating circuit 66.

The voltage comparing circuit 68 compares the voltage VB and the reference voltage VR with each other to obtain voltage VL corresponding to the result of the comparison, the result being obtained from the connection point between the MOSFET 84 and the MOSFET 88 for operation.

An end of the current passage of the MOSFET 86 for operation and an end of the current passage of the MOSFET 88 for operation are connected to a common connection point. The current passage of an N channel MOSFET 90 is, in series, connected to a position between the foregoing common connection point and the ground. The gate of the N channel MOSFET 90 is supplied with control signal VON. When the level of the control signal VON has been raised, the N channel MOSFET 90 is made to be conductive. The voltage comparing circuit 68 starts the comparison operation when the N channel MOSFET 90 has been made to be conductive.

Note that the control signal VON is controlled in accordance with, for example, a data writing/reading sequence. As a result, the comparison operation of the voltage comparing circuit 68 can be controlled to be performed if necessary in accordance with, for example, the data writing/reading sequence. Thus, wasteful enlargement of the electric consumption can be prevented.

The variable resistance circuit 70 includes an N channel MOSFET 92 having a current passage, in series, connected between the anode side end of the VPP voltage limiting circuit 56 and the ground. The gate of the N channel MOSFET 92 is supplied with voltage VL output from the voltage comparing circuit 68.

The conduction resistance of the variable resistance circuit 70 having the foregoing structure is changed in accordance with the voltage VL. By changing the conduction resistance in accordance with the voltage VL, the degree of voltage drop can be varied. The voltage VA in accordance with the foregoing dropped voltage is supplied to the anode side end of the VPP voltage limiting circuit 56.

A capacitor 94 is connected between the anode side end of the VPP voltage limiting circuit 56 and the end of the current passage of the transfer gates 72-0 to 72-7 connected commonly. The capacitor 94 is provided to prevent oscillation.

The operation of the high-voltage generating circuit 42 shown in FIG. 3 will now be described.

Initially, voltage raising clocks ø1 and ø2 are oscillated by the oscillation circuit 46. The oscillated voltage raising clocks ø1 and ø2 are supplied to the charge pump type voltage boosting circuit 44. When the charge pump type voltage boosting circuit 44 has been supplied with the voltage raising clocks ø1 and ø2, it raises the power supply voltage VCC to the internal voltage VPP for writing data. After the internal voltage VPP for writing data has been raised sufficiently, the VPP voltage limiting circuit 56 is turned on. The VPP voltage limiting circuit 56 limits the internal voltage VPP for writing data to 3×Vz+VA as described with reference to FIG. 6.

Moreover, the voltage setting circuit 62 sets voltage VA to be supplied to the anode side end of the VPP voltage limiting circuit 56 by performing the following operation.

Initially, an assumption is performed that the level of only the switch signal SW3 among the switch signals SW0 to SW7 to be supplied to the voltage generating circuit 64 included in the voltage setting circuit 62 has been raised. In this state, only the transfer gate 72-3 of the eight transfer gates 72-0 to 72-7 shown in FIG. 7 is made to be conductive. The voltage VB is VB={RB/(RA+RB)}×VA assuming that the resistance from the connection point of the output for voltage VB to the ground point is RB and the resistance from the connection point of the output for the voltage VA to the connection point of the output for the voltage VB is RA:

$$VB = \{RB/(RA+RB)\} \times VA$$

The voltage comparing circuit 68 included in the voltage setting circuit 62 is a differential operation type calculation amplifying circuit in the form as shown in FIG. 7. The calculation amplifying circuit of the foregoing type performs a comparison operation in such a manner that the voltage VB is made to be the same as the reference voltage VR. As a result, also the reference voltage VR is {RB/(RA+RB)}×VA.

The voltage VA set by the voltage setting circuit 62 is {(RA+RB)/RB}×VR, more simply {1+(RA/RB)}×VR. By changing the value of (RA/RB) in the foregoing relationship, the voltage VA can be changed. If the resistance value RB is enlarged and the resistance value RA is reduced, the voltage VA can be lowered so that the internal voltage VPP for writing data is lowered. On the other hand, if the resistance value RB is reduced and the resistance value RA is enlarged, the voltage VA can be raised so that the internal voltage VPP for writing data is raised.

In this embodiment, the voltage VA can be varied to eight values. Since the resistance value RA can be minimized and the resistance value RB can be maximized when the level of switch signal SW0 has been raised and the transfer gate 72-0 has been made to be conductive in this embodiment, the internal voltage VPP for writing data is set to be the lowest level. By sequentially shifting the transfer gates 72-0 to 72-7 which are made to be conductive in this order, the level of the internal voltage VPP for writing data can sequentially be raised.

The NAND EEPROM having the high-voltage generating circuit 42 including the voltage setting circuit 62 according to the first embodiment of the present invention is operated such that the voltage VA to be supplied to the anode side end of the VPP voltage limiting circuit 56 is changed by raising the level of any one of the switch signals SW0 to SW7 to change the transfer gate among 72-0 to 72-7 to be made to be conductive so that the internal voltage VPP for writing data is varied to eight levels.

The NAND EEPROM according to the first embodiment of the present invention, as shown in FIG. 1, includes, in the chip thereof, a set-voltage selection circuit 100 for generating a plurality of switch signals SW for changing the internal voltage VPP for writing data.

The set-voltage selection circuit 100 comprises a voltage-setting-signal generating circuit 104 in which set voltage is programmed, a voltage-setting-signal generating circuit 104 for generating a plurality of voltage setting signals LTF in accordance with the state of the program in the program circuit 102 and a switch-signal decoder 106 for decoding the setting signal LTF to activate one of the plural switch signals SW.

FIG. 8 is a circuit diagram showing the program circuit 102 and the voltage-setting-signal generating circuit 104 shown in FIG. 1.

As shown in FIG. 8, program circuit 102 includes fuses FnP (F0P to F2P) for programming the internal voltage for writing data and N channel MOSFETs 108-n (108-0 to 108-2) having the current passage, an end of which is connected to the fuse FnP and another end of which is connected to the ground. The gate of each of the MOSFETs 108-n is supplied with control signal PCHP0.

The voltage-setting-signal generating circuit 104 includes buffer circuits 110-n (110-0 to 110-2) each having an input end connected to a supply end for the control signal PCHP0 and including even number of inverters and buffer circuits 112-n (112-0 to 112-2) each having an input end connected to a connection point between the output end of each of the buffer circuits 110-n, including even number of inverters and made to be conductive in response to a command signal CM88H.

Output signals from the buffer circuits 112-n are supplied to the buffer circuits 116-n (116-0 to 116-2) including the even number of inverters so that the buffer circuits 116-n output setting signals LTFn (LTF0 to LTF2).

In this embodiment, three circuits 118 are provided each of which includes the fuse FnP, the MOSFETs 108-n, the buffer circuits 110-n and the buffer circuits 112-n and arranged to output the setting signals LTFn. As a result, the set-voltage selection circuit 100, in the inside portion thereof, generates three setting signals LTF0 to LTF2. The three setting signals LTF0 to LTF2 are complemented to one another. Thus, six setting signals LTF0, /LTF0 to LTF2 and /LTF2 generated due to the complementing process are supplied to the decoder 106.

Figure 9:
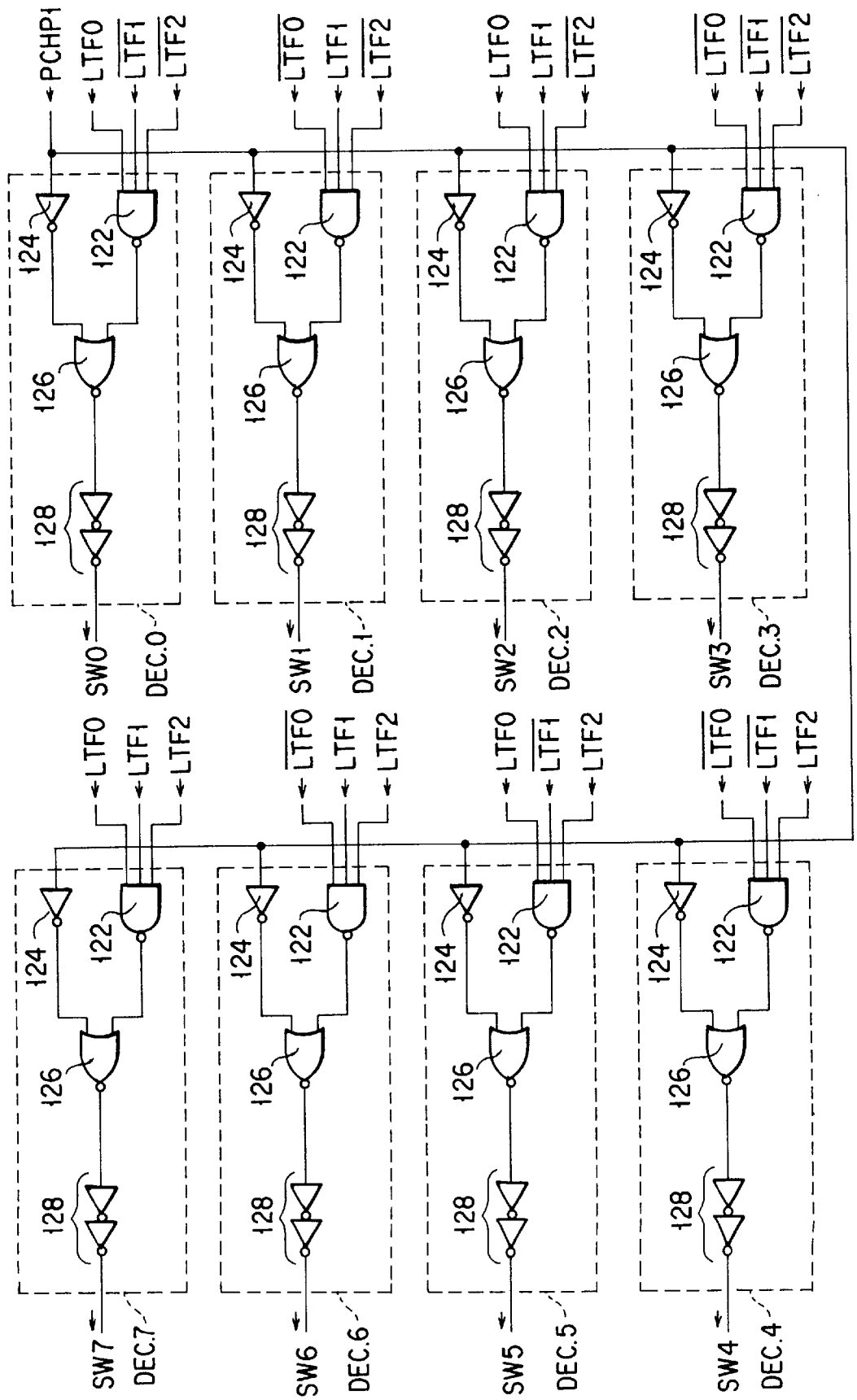
FIG. 9 is a circuit diagram showing a decoder.

FIG. 9 is a circuit diagram showing the decoder 106 shown in FIG. 1.

As shown in FIG. 9, the decoder 106 has $2^3$ decoding circuits DEC. 0 to DEC. 7 for detecting the setting signals LTF0 to LTF2.

Each of the decoding circuits DEC. 0 to DEC. 7 includes a NAND gate circuit 122 arranged to be supplied with three corresponding setting signals among the six setting signals LTF0, /LTF0 to LTF2 and /LTF2 and transmitting NAND logic of the three supplied setting signals, a NOR gate circuit 126 having a first input end connected to an output end of the NAND gate circuit 122 and a second output end connected to an output end of an inverter 124 for transmitting a reverse signal of the control signal PCHP1 and arranged to transmit the NOR logic of the reverse signal level of the control signal PCHP1 and the output signal level of the NAND gate circuit 122 and a buffer circuit 128 having a plurality of inverters having input ends connected to the output end of the NOR gate circuit 126. The switch signal SW1 is transmitted from the decoding circuit DEC. 1, while the switch signals SW2 to SW7 are sequentially transmitted from the decoding circuits DEC. 2 to DEC. 7. Note that the control signal PCHP0 is a signal, the level of which is raised in the initial stage of the writing sequence. Each of the program circuit 102 and the voltage-setting-signal generating circuit 104 is activated in response to the control signal PCHP0. As a result, the program circuit 102 and the voltage-setting-signal generating circuit 104 can individually be activated if necessary. Thus, waste enlargement of the electric power consumption can be prevented.

The control signal PCHP1 is a signal, the level of which is raised after the level of the control signal PCHP0 has been raised. The timing that PCHP1 transits from "Low" to "High" is after the PCHP0 has been in "high" state. So, LTF0 to LTF3 states are determined. Therefore malfunction of SW0 to SW7 does not occur. Also the decoder 106 can be activated if necessary in response to the control signal PCHP0. Thus, waste enlargement of the electric power consumption can be prevented.

In place of directly obtaining the switch signals SW0 to SW7 from the NAND gate circuit 122, the switch signals SW0 to SW7 are obtained through the NOR gate circuit 126 which transmits the NOR logic of the output from the NAND gate circuit 122 and the reverse signal of the control signal PCHP1 so that a malfunction of, in particular, the high-voltage generating circuit 42 is prevented. The reason for this will now be described. When the level of the control signal PCHP1 is low, that is, when the decoder 106 is in the deactivated state, the potential level of the output from the NOR gate circuit 126 can be made to be the low level regardless of the potential level of the output from the NAND gate circuit 122. When the level of the control signal PCHP1 is low, the potential levels of all switch signals SW0 to SW7 can always be made to be the low levels. When the potential levels of the switch signals SW0 to SW7 are low, all of the transfer gates 72-0 to 72-7 shown in FIG. 7 are turned off. As a result, unexpected operation, that is, malfunction of the high-voltage generating circuit 42 can be prevented.

The operation of the set-voltage selection circuit 100 shown in FIG. 1 will now be described with reference to circuit diagrams shown in FIGS. 8 and 9.

As shown in FIG. 8, the state where the three fuses F0P to F2P are disconnected includes eight states. An assumption is performed that only the fuse F0P is disconnected and the fuses F1P and F2P are not disconnected. In this state, the level of the control signal PCHP0 is raised. If the level of the control signal PCHP0 has been raised, high level signals are supplied to the input ends of the buffer circuits 110-0 to 110-2 so that the buffer circuits 110-0 to 110-2 transmit high level signals from the output ends thereof. However, the output ends of the buffer circuits 110-1 and 110-2 are grounded through the fuses F1P and F2P because the MOSFETs 108-1 and 108-2 are made to be conductive. Therefore, the high level signal is supplied to only the input terminal of the buffer circuit 112-0. The buffer circuits 112-0 to 112-2 respectively transmit high level, low level and low level signals. As a result, the levels of the setting signals LTF0, LTF1 and LTF2 respectively are made to be high, low and low levels. The setting signals LTF0, LTF1 and LTF2 having the foregoing levels respectively are supplied to the NAND gate circuits 122 of the decoding circuits DEC. 0 to DEC. 7. Only the NAND gate circuit 122 included in the decoding circuit DEC. 0 receives signals, the levels of which are high without exception because the setting signal LTF0, the reverse setting signal /LTF1 and the reverse setting signal /LTF2 are supplied. Only the NAND gate circuit 122 among the NAND gate circuits 122 respectively included in the decoding circuits DEC. 0 to DEC. 7 that is included in the decoding circuit DEC. 0 transmits a low level signal. When the level of the control signal PCHP1 has been raised afterwards, the NOR gate circuits 126 included in the decoding circuits DEC. 0 to DEC. 7 are respectively activated so that the reverse values of the outputs from the NAND gate circuits 122 are transmitted. Therefore, only the level of the switch signal SW0 to be transmitted from the decoding circuit DEC. 0 is raised. The levels of the other switch signals SW1 to SW7 are lowered.

As described above, the set-voltage selection circuit 100 of the NAND EEPROM according to the first embodiment is able to transmit only the switch signal SW0 having the high level when the program for cutting only the fuse F0P is operated. FIG. 10 shows the relationship between the eight states of the fuse FnP and the values of the setting signals. FIG. 11 shows the relationship between the eight states of the fuse FnP and input values (the setting signals) to the decoder. FIG. 12 shows the relationship between the eight states of the fuse FnP and the output values (the switch signals) from the decoder.

Moreover, the NAND EEPROM according to the first embodiment of the present invention enables the value of the set internal voltage VPP for writing data to be detected without the necessity of decomposition even after the device has been packaged by a multiplexer 130 disposed in a line for establishing the connection between the I/O data bus 34 and the output buffer 36. The multiplexer 130 multiplexes setting signal LTF and output data signal DOUT in response to control signal NRL. When the control signal NRL has been supplied, the setting signal LTF is transmitted to the outside of the integrated circuit chip through the I/O pad group 38. As a result, even after the chip has been packaged, the set internal voltage for writing data can be detected without a necessity of decomposing the chip to visually observe the state where the fuse has been cut.

Note that the control signal NRL is supplied from, for example, the outside of the chip.

Figure 13:
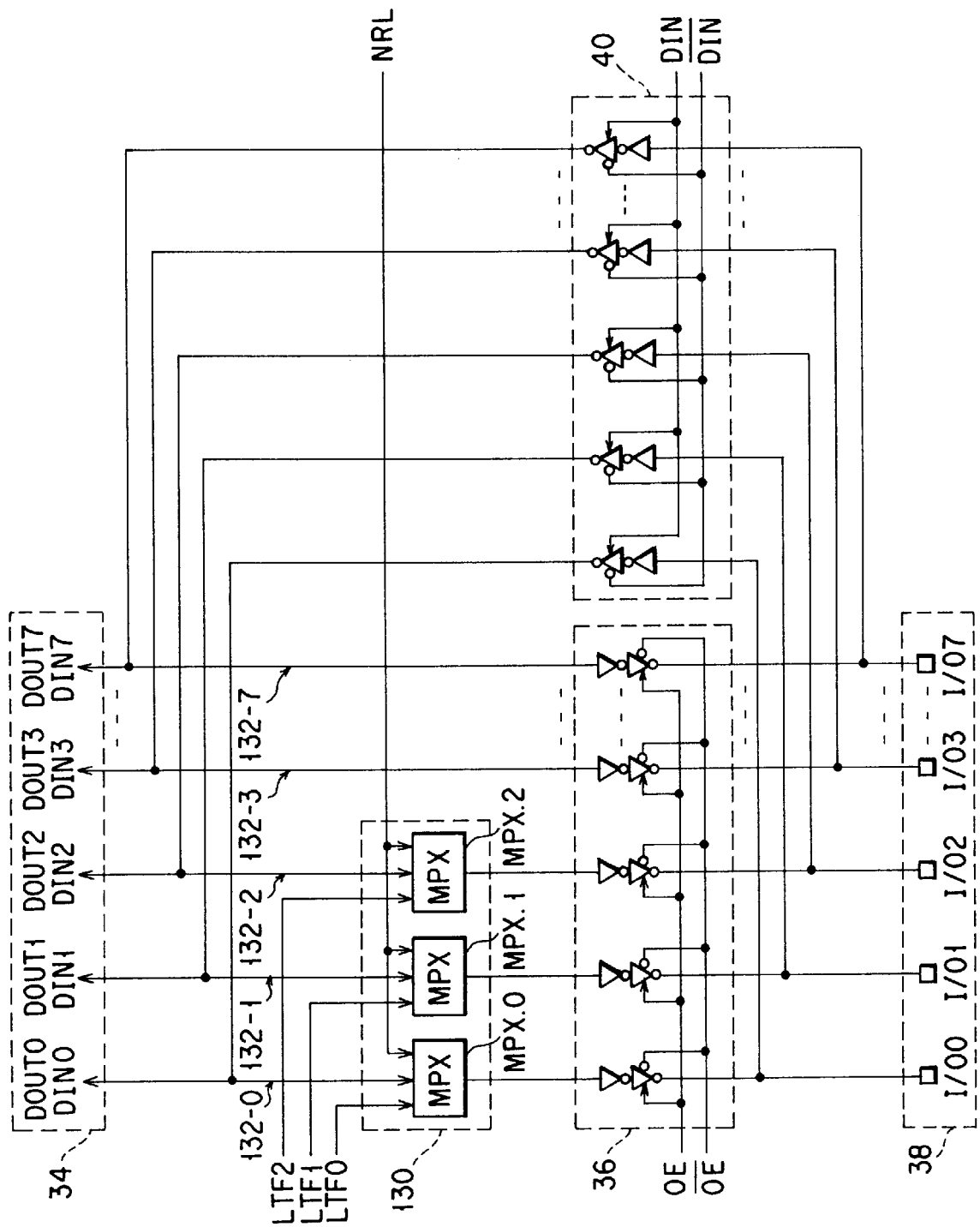
FIG. 13 is a block diagram showing a portion in the vicinity of a multiplexer.

FIG. 13 is a block diagram of the multiplexer shown in FIG. 1, and FIG. 14 is a circuit diagram showing the multiplexer shown in FIG. 1.

As shown in FIG. 13, data output lines 132-0 to 132-7 establish the connection between the I/O data bus 34 and the output buffer 36. The data output lines 132-0 to 132-7 respectively are provided to correspond to eight output data signals DOUT0 to DOUT7 such that the line 132-0 is provided for outputting data signal DOUT0 and the line 132-1 is provided for outputting data signal DOUT1. The multiplexer 130 is connected to an intermediate point between the line 132-0 and the line 132-7. The multiplexer 130 includes a first multiplexer MPX. 0 for inputting the setting signal LTF0 to the output line 132-0, a second multiplexer MPX. 1 for inputting the setting signal LTF1 to the output line 132-1 and a third multiplexer MPX. 2 for inputting the setting signal LTF2 to the output line 132-2. In response to the control signal NRL, the multiplexer MPX. 0 to MPX. 2 convert the corresponding setting signals LTF0 to LTF2 into the data signals DOUT0 to DOUT2 to supply the data signals DOUT0 to DOUT2 to the pads I/O0 to I/O2 disposed in the I/O pad group 38 through the output buffer 36. The setting signals LTF0 to LTF2 supplied to the pads I/O0 to I/O2 are, through lead terminals (not shown), transmitted to the outside of the chip.

As shown in FIG. 14, the multipexers MPX. 0 to MPX. 2 include corresponding CMOS transfer gates 134-0 to 134-2 for conducting data signals DOUT, which receive data signals DOUT0 to DOUT2 at ends of the current passages thereof, and which transmit data signals DOUT0 to DOUT2 from other ends of the current passages thereof, and CMOS transfer gates 136-0 to 136-2 for conducting setting signals LTF, which receive setting signals LTF0 to LTF2 at ends of current passages thereof and which have other ends of the current passages connected to the output ends of the transfer gates 134-0 to 134-2.

The gates of the N channel MOSFET of the transfer gates 134-0 to 134-2 are supplied with the control signal control signal NRL, while the gates of the P channel MOSFET of the same are supplied with the reverse control signal /NRL. The gates of the N channel MOSFET of the transfer gates 136-0 to 136-2 are supplied with the reverse control signal /NRL, while the gates of the P channel MOSFET are supplied with the control signal NRL. As a result, when the level of the control signal NRL is high, only the transfer gates 134-0 to 134-2 are made to be conductive so that data signals DOUT0 to DOUT2 are transmitted to the pads I/O0 to I/O2 through the output buffer 36. When the level of the control signal NRL is lowered, the transfer gates 134-0 to 134-2 are turned off and the transfer gates 136-0 to 136-2 are made to be conductive. As a result, the setting signals LTF0 to LTF2 are transmitted to the pads I/O0 to I/O2 through the output buffer 36.

To detect the set internal voltage VPP for writing data, the switch signal SW, which is finally transmitted from the set-voltage selection circuit 100, may be transmitted to the outside in place of the setting signal LTF.

However, the setting signal LTF generated in the set-voltage selection circuit 100 is transmitted to the outside in place of the switch signal SW so that the number of wiring lines can be decreased and the density of the integrated circuit is advantageously be raised. Since the switch signal SW is a signal obtained by a result of the operation of decoding the plural setting signals LTF, the number of the switch signals SW is increased by the power of the number of the setting signals LTF such that the switch signals SW is increased to $2^3$ if three setting signals LTF exist and the same is increased to $2^4$ if four setting signals LTF exist. Therefore, the number of wiring lines can be decreased by transmitting the setting signal LTF to the outside.

To detect whether the set internal voltage VPP for writing data is accurately transmitted, the voltage VL shown in FIG. 7 is amplified and then transmitted to the outside. If the level of the output of the voltage VL or the level of the output of a signal obtained by amplifying the output of the voltage VL is high, it can be determined that the value of the set internal voltage VPP for writing data is transmitted accurately.

As described above, the NAND EEPROM according to the first embodiment of the present invention has the high-voltage generating circuit 42 for selecting the internal voltage VPP for writing data from a plurality of voltage levels by the switch signal SW so that a device capable of changing the internal voltage VPP for writing data to correspond to the change in the characteristic of the cells occurring due to the dispersion in the manufacturing process is obtained.

Since the set-voltage selection circuit 100 is provided to program the internal voltage VPP for writing data, a device capable of programming the internal voltage VPP for writing data for each chip can be obtained.

Since the multiplexer 130 for transmitting the setting signal LTF to the outside is provided, the set internal voltage VPP for writing data can be detected even after the chip has been packaged without the necessity of decomposing the package. The realized capability of detecting the set internal voltage VPP for writing data without the necessity of decomposing the package is advantageous to investigate the cause of an abnormal operation of the chip. For example, the package is not needed to be decomposed, that is, the integrated circuit is not needed to be broken to investigate the cause of an abnormal operation.

A NAND EEPROM according to a second embodiment of the present invention will now be described. The NAND EEPROM according to the second embodiment has a structure such that the internal voltage VPP for writing data of the NAND EEPROM according to the first embodiment can be set variable in response to a signal supplied from the outside. As a result, the operation of the device can previously be verified by using the various levels of the internal voltage VPP for writing data before the fuse is cut. Thus, an optimum level of the internal voltage VPP for writing data can be detected for each chip. Moreover, the optimum level obtained by the previous verification can be semipermanently maintained.

FIG. 15 is a block diagram showing the NAND EEPROM according to the second embodiment of the present invention.

As shown in FIG. 15, the NAND EEPROM according to this embodiment is particularly different from the NAND EEPROM shown in FIG. 1 in a set voltage selection circuit 100'. The set-voltage selection circuit 100' includes a test program circuit 140 capable of varying the setting signal LTF in response to a signal input from outside.

FIG. 16 is a circuit diagram showing a program circuit 102, a voltage-setting-signal generating circuit 104 and a test program circuit 140 shown in FIG. 15.

As shown in FIG. 16, the structures of the program circuit 102 and the voltage-setting-signal generating circuit 104 are similar to those of the NAND EEPROM shown in FIG. 1. The test program circuit 140 includes latch circuits 142-n (142-0 to 142-2) which are capable of changing data stored therein in response to a signal supplied from outside and buffer circuits 144-n (144-0 to 144-2) having input ends connected to the output ends of the latch circuits 142-n, including a plurality of inverters and made to be conductive in response to command signal CM88H. The buffer circuits 144-n are operated complementarily with buffer circuits 112-n (112-0 to 112-2) in response to the command signal CM88H. The output ends of the buffer circuits 144-n are connected to lines which establish the connection between the output ends of the buffer circuits 112-n and the first input ends of the NAND gate circuits 114-n. As a result, output signals from the buffer circuits 144-n can be supplied to the input ends of the NAND gate circuits 114-n in place of the output signals from the buffer circuits 112-n.

The latch circuits 142-n include corresponding first inverters 146-n (146-0 to 146-2), second inverters 148-n (148-0 to 148-2) having input ends connected to the output ends of the first inverters 146-n and CMOS transfer gates 150-n (150-0 to 150-2) having current passages, in series, connected between the input ends of the first inverters 146-n and the output ends of the second inverters 148-n. The gates of the N channel MOSFET of the CMOS transfer gates 150-n are supplied with the control signal FVPP, while the gates of the P channel MOSFET of the same are supplied with reverse control signal /FVPP. The connection points between the current passages of the transfer gates 150-n and the output ends of the second inverters 148-n are connected to the input ends of the buffer circuits 144-n.

Ends of the current passages of the CMOS transfer gates 152-n (152-0 to 152-2) are connected to the connection points between the current passages of the transfer gates 150-n and the input ends of the first inverters 146-n, the CMOS transfer gates 152-n having other ends for receiving input signals DINnS (DIN0S to DIN2S) and being arranged to transfer the input signals DINsS to the latch circuits 142-n. The gates of the N channel MOSFETs of the transference CMOS transfer gate 152-n are supplied with the reverse control signal /FVPP, while the gates of the P channel MOSFETs of the same are supplied with the control signal FVPP. As a result, the CMOS transfer gates 152-n for transferring the signals are complementarily operated with the CMOS transfer gates 150-n disposed in the latch circuits 142-n.

Moreover, an end of the current passage of an N channel MOSFET 154 for writing initial data to the latch circuits 142-n is connected to the connection points between the current passages of the transfer gates 150-n and the input ends of the first inverters 146-n. Another end of the current passage of the MOSFET 154 for writing initial data is grounded, the MOSFET 154 having a gate to which control signal P4VON is supplied. The control signal P4VON is a signal, the level of which is raised when, for example, the power is supplied to the device. In a period in which the level of the control signal P4VON is high, the MOSFET 154 for writing initial data is made to be conductive so that a high level signal is supplied to each of the input ends of the first inverters 146-n. As a result, a low level signal is supplied to the buffer circuits 144-0.

Note that the command signal CM88H is a signal, the level of which is raised when the level of the internal voltage VPP for writing data is experimentally set and the level of which is lowered when the internal voltage VPP for writing data which has been set by fuse FnP is used.

The operation of the set-voltage selection circuit 100' shown in FIG. 15 will now be described with reference to a circuit diagram shown in FIG. 16.

Since the operation to be performed after the fuses F0P to F2P have been cut is the similar to that of the NAND EEPROM according to the first embodiment, the operation is omitted from the description. The description will be made about the operation to be performed only when the test program is performed.

Initially, electric power is supplied to the device. When the electric power has been supplied, the level of the control signal P4VON is temporarily raised and, therefore, the MOSFET 154 is made to be conductive. Thus, same data is written to the latch circuits 142-0 to 142-2. Written data is data for supplying low level signals to the input ends of the buffer circuits 144-0 to 144-2.

At this time, the level of control signal FVPP has been raised so that the transfer gates 150-0 to 150-2 are made to be conductive and the transfer gates 152-0 to 152-2 are turned off.

The level of the control signal PCHP0 is lowered so that also a low level signal is supplied to each second input end of the NAND gate circuits 114-0 to 114-2. Therefore, the NAND gate circuits 114-0 to 114-2 respectively transmit high level signals so that the levels of all of the setting signals LTF0 to LTF2 are lowered.

To test the internal voltage VPP for writing data, the eight combinations of values of input signals DIN0S to DIN2S are supplied. An example of the combinations will now be described in which the levels of the input signals DIN1S and DIN2S are made to be the low levels.

Initially, the level of the input signal DIN0S is raised and the levels of the input signals DIN1S and DIN2S are lowered. Then, the level of the control signal FVPP is lowered. When the level of the control signal FVPP has been lowered, the transfer gates 152-0 to 152-2 are made to be conductive so that the transfer gates 150-0 to 150-2 are turned off. As a result, the input signals DIN0S to DIN2S are transferred to the latch circuits 142-0 to 142-2. After the input signals DIN0S to DIN2S have been transferred to the latch circuits 142-0 to 142-2, the level of the control signal FVPP is raised, the transfer gates 152-0 to 152-2 are turned off, and the transfer gates 150-0 to 150-2 are made to be conductive. As a result, data corresponding to the input signals DIN0S to DIN2S is stored in the latch circuits 142-0 to 142-2. In this embodiment, data is stored in the latch circuits 142-0 to 142-2 such that data stored by only the latch circuit 142-0 is reversed as compared with the initial data.

The foregoing operation is performed after the MOSFET 154 has been turned off.

Then, the level of the command signal CM88H is raised, the buffer circuits 144-0 to 144-2 are activated and the buffer circuits 112-0 to 112-2 are deactivated. Therefore, the first input ends of the NAND gate circuits 114-0 to 114-2 are supplied with high or low level signals from the buffer circuits 144-0 to 144-2 in accordance with data stored in the latch circuits 142-0 to 142-2.

Then, the level of the control signal PCHP0 is raised. In a period in which the level of the control signal PCHP0 is high, the NAND gate circuits 114-0 to 114-2 are activated. Only the NAND gate circuit 114-0 among the activated NAND gate circuits 114-0 to 114-2 transmits a low level signal. As a result, the levels of the setting signals LTF0, LTF1 and LTF2 are made to be high level, low level and low level, respectively.

The foregoing state is equivalent to the state described with reference to FIG. 8 in which only the fuse F0P has been cut. Therefore, the level of only the switch signal SW0 transmitted from the decoding circuit DEC. 0 is raised, while the levels of all of the other switch signals SW1 to SW7 are lowered.

In the foregoing state, the writing operation is performed. If the writing operation is too slow, that is, an excessively long time takes place for the threshold of the memory cell to be shifted to a predetermined threshold, an operation for raising the level of the internal voltage VPP for writing data is performed.

In this embodiment, the level of only the switch signal SW0 is raised and the levels of all of the other switch signals SW1 to SW7 are lowered. Therefore, the foregoing state is a state where the internal voltage VPP for writing data is set to 17V when a reference is made to the table shown in FIG. 12.

To raise the level of the internal voltage VPP for writing data from 17V to 18V, the fuse F1P is needed to be cut as shown in FIG. 10. Therefore, the level of the input signal DIN1S is raised and the levels of the input signals DIN0S and DIN2S are lowered.

As described above, the NAND EEPROM having the test program circuit 140 shown in FIG. 16 is able to realize the state where the fuses F0P to F2P are cut by raising or lowering the level of each of the input signals DIN0S to DIN2S. Therefore, the fuse needed to be cut, that is, the level of the internal voltage VPP for writing data can be determined appropriately before the fuses F0P to F2P are cut.

The NAND EEPROMs according to the first and second embodiments is arranged to minimize the fuse cutting process by employing a structure such that no fuse is cut when the voltage level is the internal voltage VPP for writing data which is expected to take place most frequently.

In the case shown in FIG. 10, no fuse is cut when state 4 is realized. The state 4 is, as shown in FIG. 12, a state where the internal voltage VPP for writing data is 20V. That is, the NAND EEPROM according to the first and second embodiments have circuits and cells designed in such a manner that the internal voltage VPP for writing data is made to be 20V.

The input signal DIN0S and DIN2S are supplied to the inside of the device through the I/O pad group 38.

Figure 17:
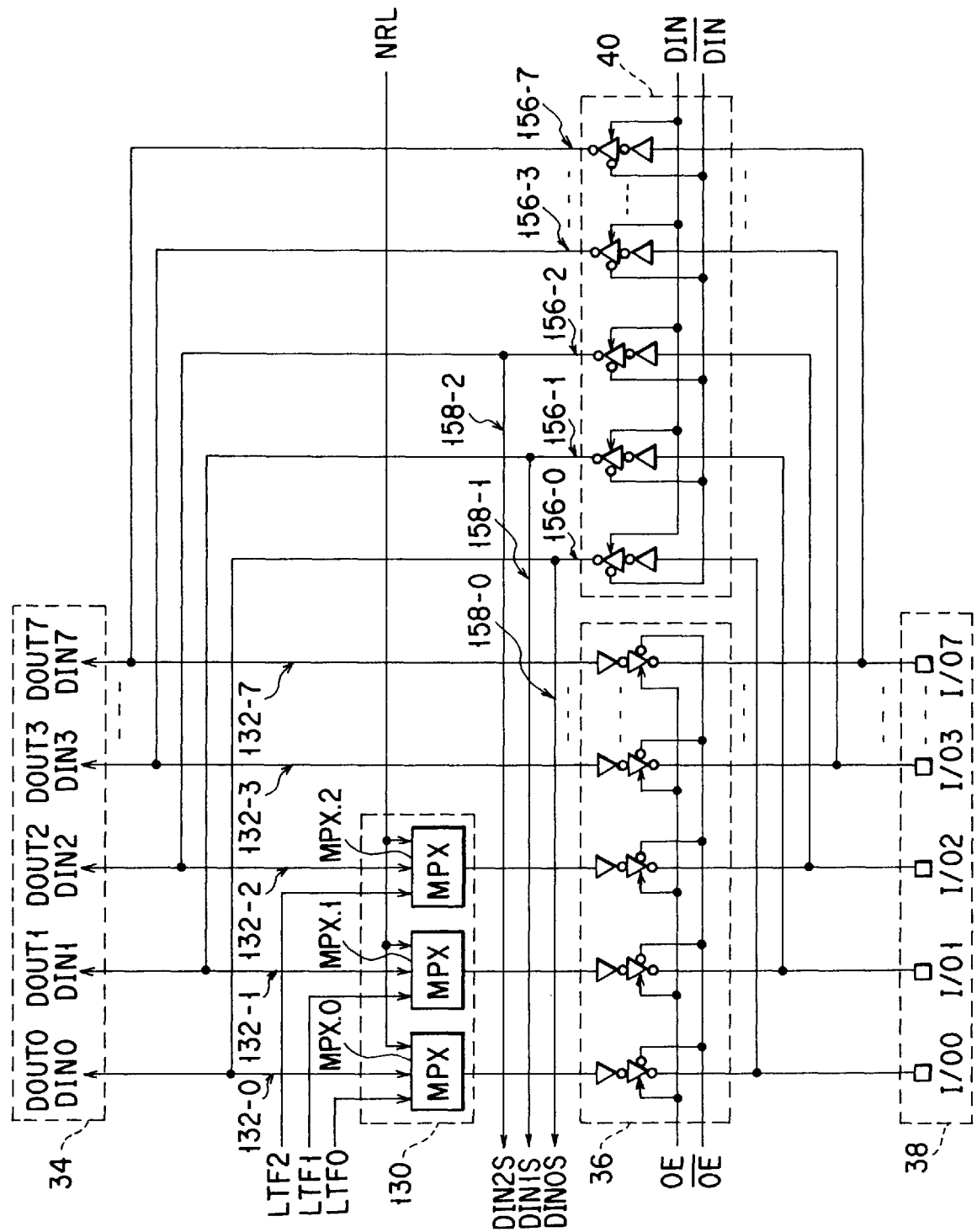
FIG. 17 is a block diagram showing a portion in the vicinity of the multiplexer.

FIG. 17 is a block diagram showing a portion in the vicinity of the multiplexer shown in FIG. 15.

As shown in FIG. 17, there are provided data input lines 156-0 to 156-7 for establishing the connections between the I/O data bus 34 and the input buffer 40. The data input lines 156-0 to 156-7 are provided to correspond to eight output data signals DIN0 to DIN7 such that the line 156-0 is provided for inputting the data signal DIN0 and the line 156-1 is provided for inputting the data signal DIN1. Lines 158-0 to 158-2 for supplying DIN0S to DIN2S to a test program circuit 140 are connected to intermediate points of the lines 156-0 to 156-2 among the lines 156-0 to 156-7.

The input signals DIN0S to DIN2S supplied from outside of the chip to the pad I/O0 to I/O2 through lead terminals (not shown) respectively are supplied to the data input lines 156-0 to 156-2, and then supplied to the lines 158-0 to 158-2 connected to the data input lines 156-0 to 156-2, followed by being supplied from the lines 158-0 to 158-2 to the test program circuit 140.

A NAND EEPROM according to a third embodiment of the present invention will now be described.

The NAND EEPROM according to the third embodiment has a structure such that the high-voltage generating circuit 42 of the NAND EEPROM according to the first embodiment and capable of switching the voltage in response to the switch signal is used to cause the high-voltage generating circuit 42 to be capable of generating internal voltage VPP for writing data and erasing internal voltage VEE. As a result, the necessity of providing the high-voltage generating circuit 42 for each of the internal voltage VPP for writing data and the erasing internal voltage VEE can be eliminated. Thus, the size of the circuit can be minimized and the area of the chip of the device can be reduced.

Figure 18:
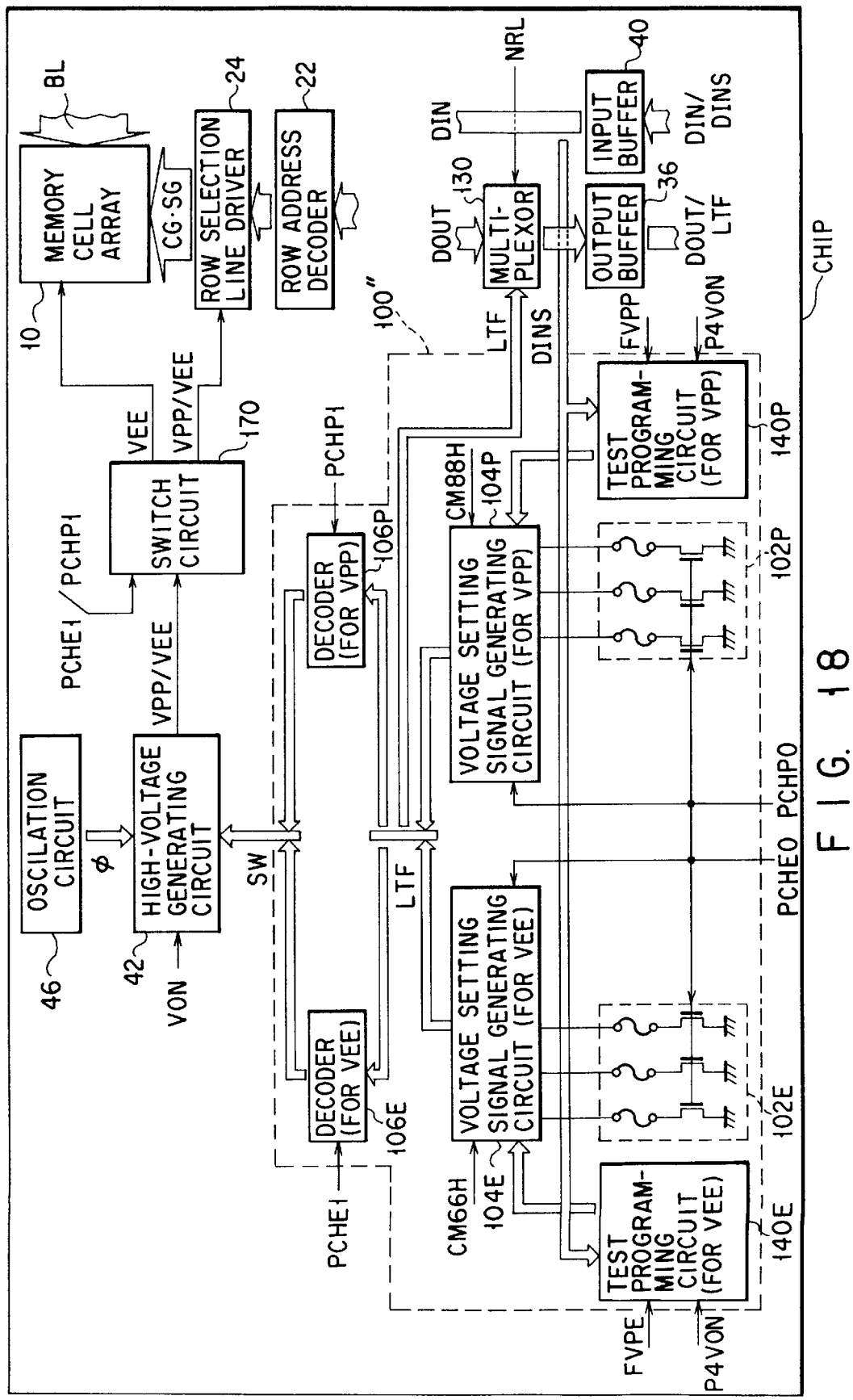
FIG. 18 is a block diagram showing a NAND EEPROM according to a third embodiment of the present invention.

FIG. 18 is a block diagram showing the NAND EEPROM according to a third embodiment of the present invention.

As shown in FIG. 18, the NAND EEPROM according to this embodiment is different from the NAND EEPROM shown in FIG. 1 and that shown in FIG. 15 is a set-voltage selection circuit 100".

The set-voltage selection circuit 100" includes a data writing program circuit 102P into which the internal voltage VPP for writing data is programmed, a data erasing program circuit 102E into which the erasing internal voltage VEE is programmed, a data-writing-voltage setting signal generating circuit 104P for generating a plurality of setting signals LTF in accordance with the state of program in the program circuit 102P, a data-erasing-voltage setting signal generating circuit 104E for generating a plurality of setting signals LTF in accordance with the state of program in the program circuit 102E, a data writing switch signal decoder 106P for decoding the setting signal LTF to activate one of the plural switch signals SW, a data erasing switch signal decoder 106E, a data writing test program circuit 140P capable of varying the setting signal LTF when a signal has been supplied from outside and a data erasing test program circuit 140E.

Figure 19:
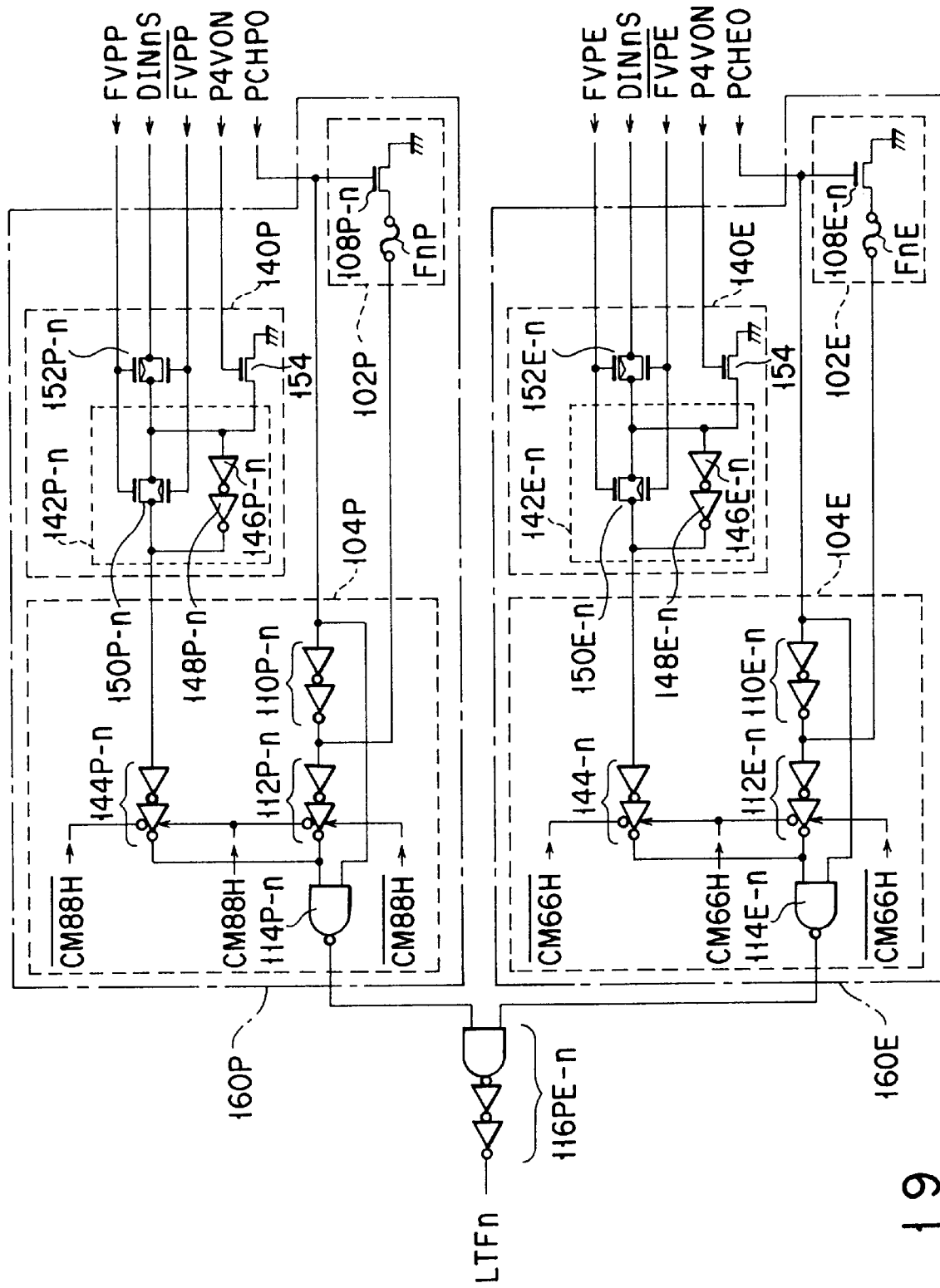
FIG. 19 is a circuit diagram showing a programming circuit, a voltage setting signal generating circuit and a programming circuit for a test.
Figure 20:
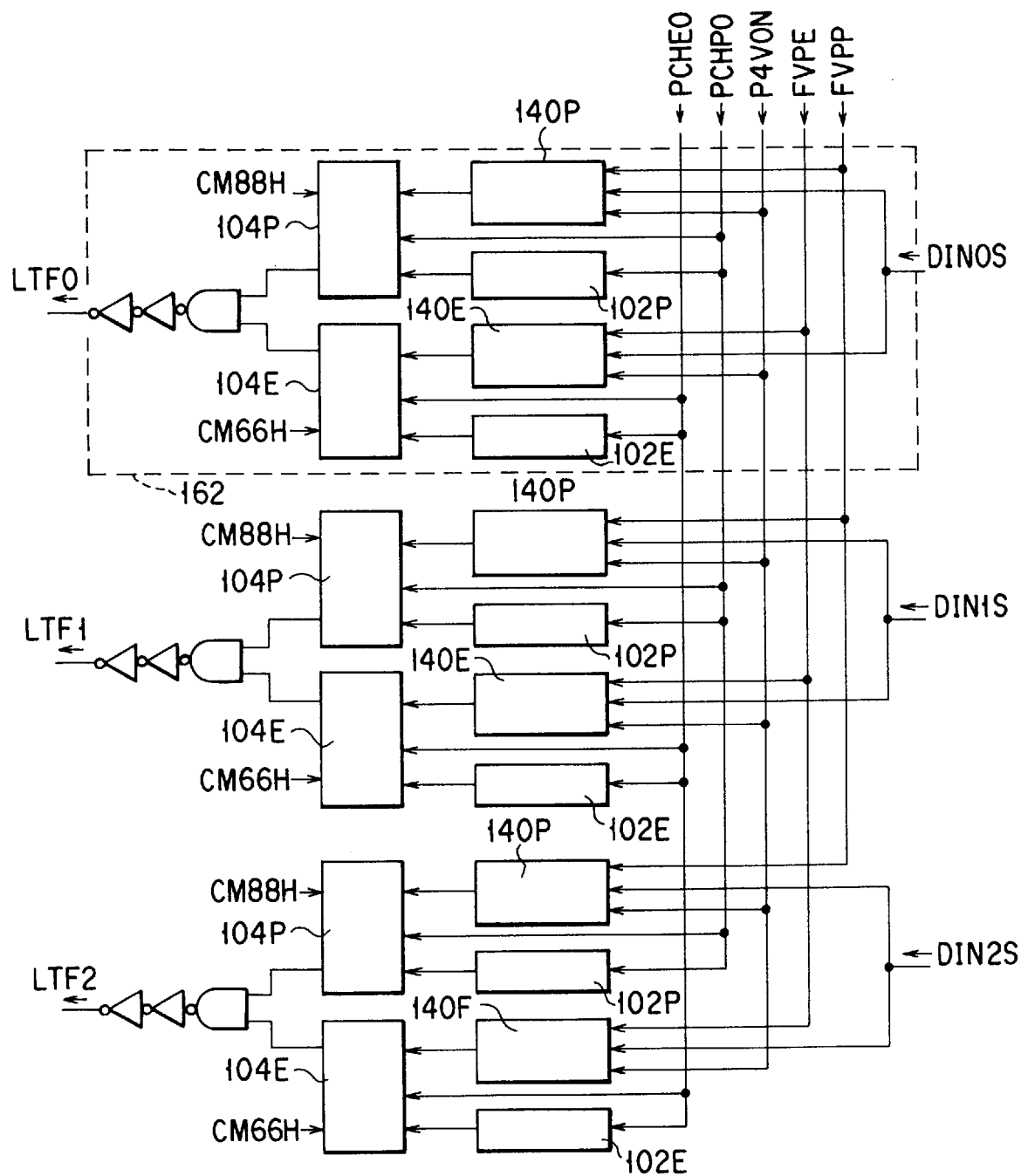
FIG. 20 is a block diagram showing the programming circuit, the voltage setting signal generating circuit and the programming circuit for a test.

FIG. 19 is a circuit diagram showing the program circuits 102P and 102E, the voltage setting signal generating circuits 104P and 104E and the test program circuits 140P and 140E shown in FIG. 18. FIG. 20 is a block diagram showing program circuits 102P and 102E, the voltage setting signal generating circuits 104P and 104E and the test program circuits 140P and 140E shown in FIG. 18.

As shown in FIG. 19, the circuits for generating the setting signals LTFn in accordance with the states of program in the program circuits 102P and 102E or those in the test program circuits 140P and 140E are mainly the circuit 160P for use when data is written and the circuit 160E for use when data is erased. In this embodiment, the buffer circuits 116PE-n calculate the NAND logic of the output signal from the circuit 160P and that from the circuit 160E to obtain a plurality of setting signals LTFn by using the NAND logic.

The circuit 160P includes a test program circuit 140P similar to that of the device according to the second embodiment, while the circuit 160E includes a test program circuit 140E having a structure similar to that of the test program circuit 140P. Therefore, the NAND EEPROM according to the third embodiment is able to carry out the writing operation test as described in the second embodiment and the erasing operation test. When the erasing operation test is conducted, the input signal DINnS is fetched into the latch circuits 142E-n in response to an erasing operation test control signal FVPE similarly to the writing operation test to cause the latch circuit 142E-n to store data corresponding to the input signal DINnS. Data stored in the latch circuit 142E-n is made to correspond to a state of cutting of the fuse FnE included in the erasing program circuit 102E.

The circuit 160P is controlled in accordance with the command signal CM88H described in the first and second embodiments and arranged to be used to experimentally setting the internal voltage VPP for writing data so as to instruct the writing sequence. The circuit 160E is controlled in accordance with the command signal CM66H arranged to be-used to experimentally set the erasing internal voltage VEE so as to instruct the erasing sequence.

The operations of the circuits 160P and 160E will be described schematically.

When the levels of both of the command signals CM88H and CM66H are low, both of the levels of the output signal from the circuit 160P and that from the circuit 160E are made to be low so that the levels of all of the setting signals LTFn are fixed to low levels.

When a usual writing sequence is performed in this state, the level of the control signal PCHP0 is raised and that of the control signal PCHE0 is lowered so that the levels of the setting signals LTFn respectively are made to correspond to the state of the fuse FnP. That is, when the fuse FnP has been cut, the level of the setting signal LTFn is raised. If the fuse FnP is not cut, the levels of the setting signals LTFn are lowered.

When a usual erasing sequence is performed, the level of the control signal PCHE0 is raised and that of the control signal PCHP0 is lowered so that the levels of the setting signals LTFn respectively are made to correspond to the state of the fuse FnE. That is, if the fuse FnE has been cut, the levels of the setting signals LTFn are raised. If the fuse FnE is not cut, the levels of the setting signals LTFn are lowered.

When the writing sequence is performed in such a manner that the internal voltage VPP for writing data is experimentally set, the level of the command signal CM88H is raised and the low level of the command signal CM66H is maintained. Since the level of the control signal PCHE0 is low at this time, the output signal from the circuit 160P is changed in accordance with the states of latching in the latch circuits 142P-n in such a manner that the high level of the output signal from the circuit 160E is maintained. When the level of the output signal from the circuit 160P is high, the levels of the setting signals LTFn are lowered. When the level of the output signal from the circuit 160P is low, the levels of the setting signals LTFn are raised.

When the erasing sequence is performed in such a manner that the erasing internal voltage VEE is experimentally set, the level of the command signal CM66H is raised so that the low level of the command signal CM88H is maintained. In this case, the process is performed in a manner different from the experimental writing sequence such that the output signal from the circuit 160E is changed in accordance with the state of latching in the latch circuit 142E-n in such a manner that the high level of the output signal from the circuit 160P is maintained. If the level of the output signal from the circuit 160E is high, the level of the setting signals LTFn is lowered. If the level of the output signal from the circuit 160E is low, the level of the setting signals LTFn is raised.

As shown in the block diagram shown in FIG. 20, the NAND EEPROM according to the third embodiment has the three circuits shown in FIG. 19. The block given reference numeral 162 in FIG. 20 corresponds to the circuit shown in FIG. 19.

Figure 21:
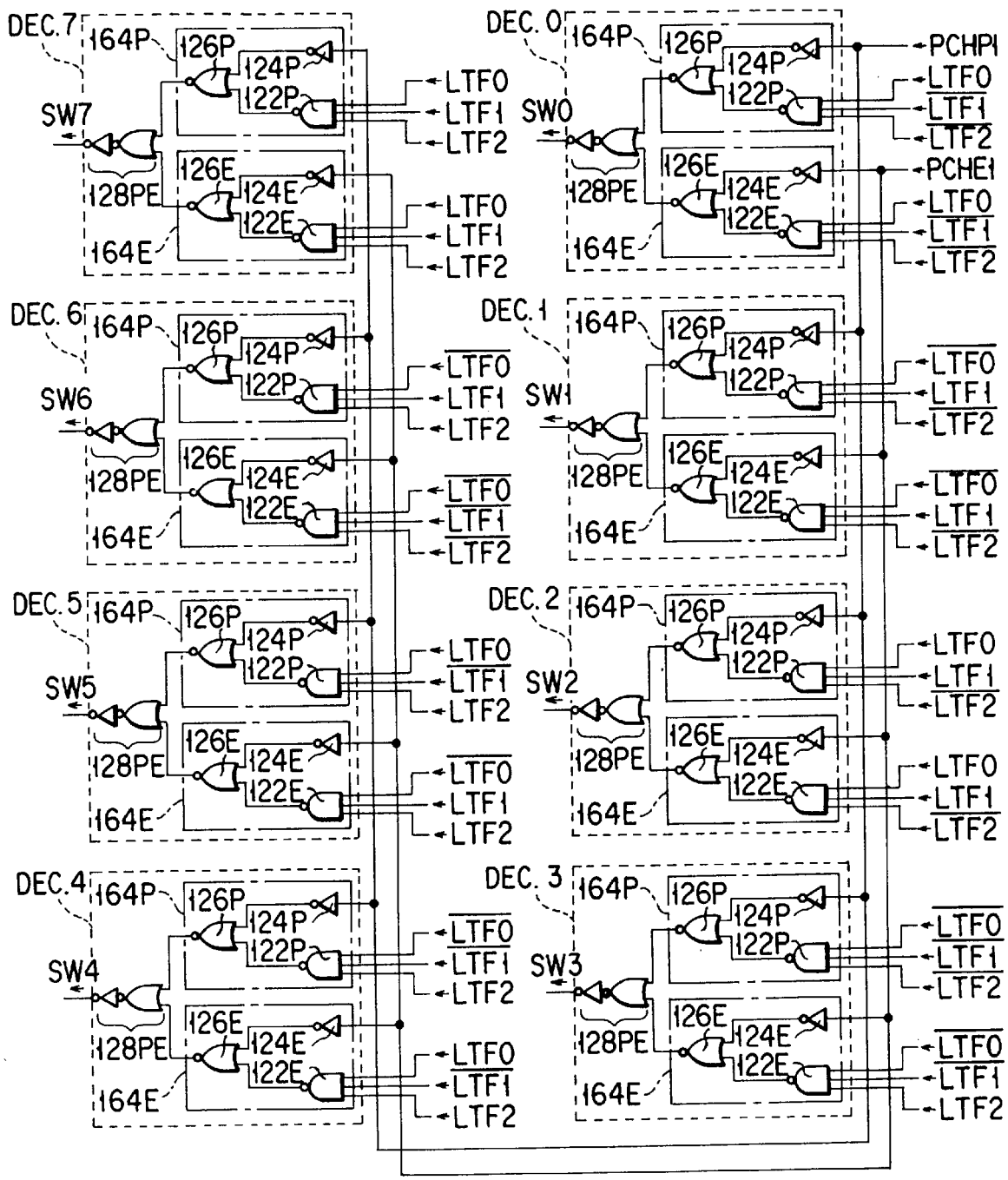
FIG. 21 is a circuit diagram showing a decoder.
Figure 28A:
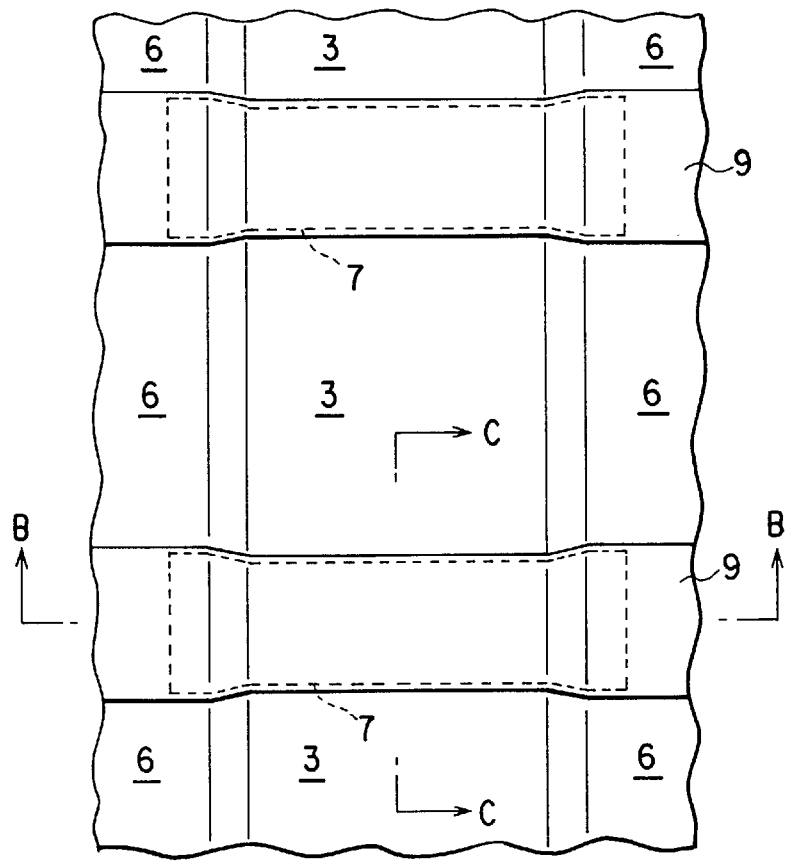
FIG. 28A is a plane view showing a memory cell.
Figure 28B:
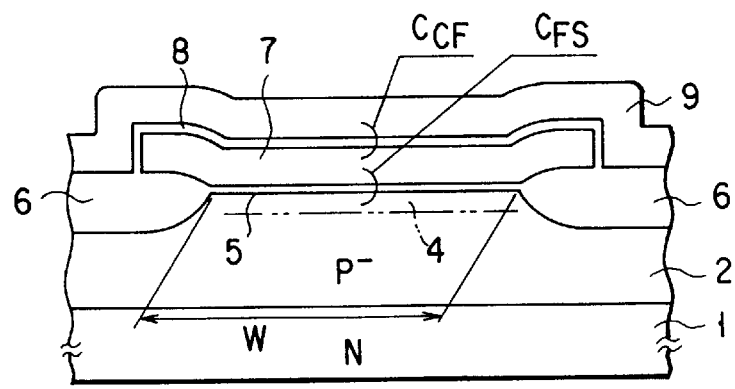
FIG. 28B is a cross sectional view taken along line B—B shown in FIG. 28A.
Figure 28C:
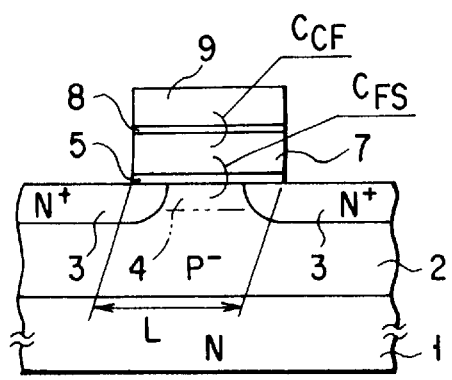
FIG. 28C is a cross sectional view taken along line C—C shown in FIG. 28A.

FIG. 21 is a circuit diagram showing decoders 106P and 106E for decoding plural setting signals LTF to transmit plural switch signals SW.

As shown in FIG. 21, the decoders 106P and 106E include decoding circuit DEC. n (DEC. 0 to DEC. 7). Each of the decoding circuits DEC. n includes a circuit 164P for use when data is written and a circuit 164E for use when data is erased. In this embodiment, the OR logic of the output signal from the circuit 164P and that from the circuit 164E are calculated and the OR logic is used to obtain a plurality of switch signals SWn (SW0 to SW7).

The circuit 164P is controlled in response to the control signal PCHP1 described in the first embodiment and having the level which is raised after the level of the control signal PCHP0 has been raised. On the other hand, the circuit 164E is controlled in response to the control signal PCHE1 having the level which is raised after the control signal PCHE0 has been raised.

The operations of the circuits 164P and 164E will schematically be described.

When the levels of both of the control signals PCHP1 and PCHE1 are low, the levels of both of the output signals from the circuits 164P and 164E are low so that the levels of all of the switch signals SWn are fixed to low levels.

When the level of the control signal PCHP1 is high and that of the control signal PCHE1 is low in the writing sequence, only the output signal from the circuit 164P is changed in accordance with the level of the output signal from the NAND gate circuit 122P in such a manner that the low level of the output signal from the circuit 164E is maintained. When the level of the output signal from the circuit 164P is high, the level of the switch signal SWn is raised. When the level of the output signal from the circuit 164P is low, the level of the switch signal SWn is lowered.

When the level of the control signal PCHE1 is high and that of the control signal PCHP1 is low in the erasing sequence, only the output signal from the circuit 164E is changed in accordance with the level of the output signal from the NAND gate circuit 122E in such a manner that the low level of the output signal from the circuit 164P is maintained. When the level of the output signal from the circuit 164E is high, the level of the switch signal SWn is raised. When the level of the output signal from the circuit 164E is low, the level of the switch signal SWn is lowered.

FIG. 22 shows the relationship between the eight states of the erasing fuses FnE and the levels of the setting signals. FIG. 23 shows the relationship between the eight states of the fuses FnE and input values (setting signals) to the decoders. FIG. 24 shows the relationship between the eight states of the fuses FnE and output values (the switching signals) from the decoders.

In the NAND EEPROM according to the third embodiment, the relationship among the eight states of the writing fuses FnP, the levels of the setting signals, input values (the setting signals) to the decoders and output values from the decoders are similar to those shown in FIGS. 10, 11 and 12.

The NAND EEPROM according to the third embodiment, as shown in FIG. 18, commonly uses one high-voltage generating circuit 42 to generate the internal voltage VPP for writing data and to generate the erasing internal voltage VEE. The internal voltage VPP for writing data generated by one high-voltage generating circuit 42 is supplied to the row selection line driver 24. The erasing internal voltage VEE is supplied to the row selection line driver 24 and the well and the substrate which are placed in the memory cell 10 and in which the cell is formed. Therefore, the portion, to which the internal voltage to be generated by the high-voltage generating circuit 42 is supplied, is needed to be switched between the writing sequence and the erasing sequence. A switch circuit 170 shown in FIG. 18 switches the portion to which the internal voltage generated by the high-voltage generating circuit 42 is supplied between the writing sequence and the erasing sequence. The switch circuit 170 uses, for example, the control signal PCHP1 or PCHE1 with which the writing sequence and the erasing sequence can be distinguished from each other to switch the portion to which the internal voltage generated by the high-voltage generating circuit 42 is supplied.

The row selection line driver 24 of the NAND EEPROM according to the third embodiment is, as shown in FIG. 18, supplied with the erasing internal voltage VEE as well as the internal voltage VPP for writing data.

FIG. 25 is a block diagram showing the row address decoder 22, the row selection line driver 24 and the memory cell 10 shown in FIG. 18.

As shown in FIG. 25, the row address decoder 22 includes a main decoding circuit 172 for decoding three low addresses, for example, low addresses A3R to A5R and transmitting eight output signals MDO and a partial decoding circuit 174 for decoding other row addresses, for example, three row addresses A0R to A2R and transmitting eight partial decoding output signals PDO. The main decoding output signal MDO and the partial decoding output signal PDO are supplied to the row selection line driver 24. The main decoding output signal MDO0 selects one of blocks each consisting of a group of NAND cells 12. The partial decoding output signal PDO selects one of cells (not shown) formed in the NAND cell 12. The row selection line driver 24 includes operation circuits DRV. 0 to DRV. 7 provided for each eight main decoding output signals MDO.

FIG. 26 is a circuit diagram showing the operation circuits (DRV. n) shown in FIG. 25.

As shown in FIG. 26, each of the operation circuits DRV. n (DRV. 0 to DRV. 7) is supplied with power supply voltage V1 to V3 so as to be controlled in response to control signals S1 to S5. The levels of the power supply voltages V1 to V3 and the control signals S1 to S5 when data is read, when data is written and when data is erased are shown in FIG. 27.

The writing operation and erasing operation to be performed by the operation circuit shown in FIG. 26 will now be described.

When data is written, the levels of the controls signals S1 and S5 are made to be level "VCC" and those of the control signals S2, S3 and S4 are made to be level "GND". Thus, the CMOS transfer gate 180 is turned on and the CMOS transfer gate 182 is turned off.

An N channel MOSFET 184 which receives the control signal S1 at the gate thereof is turned on and an N channel MOSFET 186, a P channel MOSFET 188 and an N channel MOSFET 190 which receive the control signal S3 at their gates respectively are turned off, turned on and turned off. An N channel MOSFET 192 which receives the control signal S4 at the gate thereof is turned off, while an N channel MOSFET 194 which receives the control signal S5 at the gate thereof is turned on.

As a result, the first selection gate line SG1 is supplied with the potential (VM) of the power source V2 when the level of the main decoding output signal MDOn is high. When the level of the main decoding output signal MDOn is low, the first selection gate line SG1 is supplied with the ground potential (GND). The second selection gate line SG2 is always supplied with the ground potential (GND) regardless of the level of the main decoding output signal MDOn.

When the level of the main decoding output signal MDOn is high, gates of all N channel MOSFETs of the CMOS transfer gate group 196 are supplied with the potential (VPP) of the power supply V1 and the gates of all of the P channel MOSFETs are supplied with the ground potential (GND). As a result, all gates of the CMOS transfer gate group 196 are turned on. All of transistors of a transistor group 198, having the current passage, an end of which is connected to the control gate line CG and another end of which is grounded, are turned off. Control gate line CG selected from a level shift circuit group 200 in response to the partial decoding output signals PDOn (PDO0 to PDO7) is supplied with the potential VPP, while other control gate lines CG are supplied with intermediate potential VM. As a result, data can be written to the cells connected to the control gate lines CG which are being supplied with the potential VPP.

When the levels of the main decoding output signal MDOn are low, all of the gates in the CMOS transfer gate group 196 are turned off and all of the transistors in the transistor group 198 are turned on. Thus, the ground potential (GND) is supplied to all of the control gate lines CG. As a result, data writing to all cells is inhibited.

As described above, blocks, to which data is needed to be written, can be selected in accordance with the main decoding output signal MDOn. Moreover, rows, to which data is needed to be written, can be selected from the selected block in accordance with the partial decoding output signals PDO0 to PDO7.

The erasing operation will now be described. When data is erased, the levels of the control signals S1, S4 and S5 are made to be the level "GND", that of the control signal S2 is made to be the level "VCC" and that of the control signal S3 is made to be the level "VEE". As a result, the CMOS transfer gate 180 is turned off and the CMOS transfer gate 182 is turned on.

The N channel MOSFET 184, having the gate which is supplied with the control signal S1, is turned off, and the N channel MOSFET 186, the P channel MOSFET 188 and the N channel MOSFET 190, each having the gate which is supplied with the control signal S3, are respectively turned on, turned off and turned off. The N channel MOSFET 192, having the gate which is supplied with the control signal S4, is turned off, while the N channel MOSFET 194, having the gate which is supplied with the control signal S5, is turned off.

As a result, the first selection gate line SG1 and the second selection gate line SG2 are supplied with the potential obtained by subtracting the threshold of the N channel MOSFET from the potential (VEE) of the power source V3 regardless of the level of the main decoding output signal MDOn.

When the level of the main decoding output signal MDOn is high, all of the transfer gates of the CMOS transfer gate group 196 are turned off and all of the transistors in the transistor group 198 are turned on. As a result, the ground potential (GND) is supplied to the control gate line CG. When the control gate line CG is grounded and the well and the substrate (not shown) are supplied with the potential VEE, data can collectively be erased from all cells connected to the operation circuit to which the high level main decoding output signal MDOn is supplied.

When the levels of the main decoding output signal MDOn are low, all of the transfer gates in the CMOS transfer gate group 196 are turned on and all of the transistors in the transistor group 198 are turned off. As a result, the output from a level shift circuit group 200 can be supplied to the control gate line CG. By supplying the potential VEE from the level shift circuit group 200 to the control gate line CG, blocks from which data is not erased can be obtained.

As described above, blocks from which data is needed to be erased can be selected in accordance with the main decoding output signal MDOn. Thus, data can collectively be erased from all blocks and data can collectively be erased from only the selected blocks.

The NAND EEPROM according to the third embodiment enables the erasing operation test to be performed in accordance with the combination of the cutting states of the fuses FnE. Therefore, an optimum level of the erasing internal voltage VEE, as well as the writing internal voltage VPP, obtained by the test can semipermanently be determined by the fuses FnE.

Since the multiplexer 130 for fetching the setting signal LTF to the outside of the chip is provided as shown in FIG. 18, the internal voltage VPP for writing data and the erasing internal voltage VEE can be detected without the necessity of decomposing the chip. Therefore, if the chip performs an abnormal operation, the cause can be investigated in accordance with the level of the erasing internal voltage VEE as well as the internal voltage VPP for writing data.

Since one high-voltage generating circuit 42 is commonly used to generate the internal voltage VPP for writing data and the erasing internal voltage VEE as shown in FIG. 18, the size of the circuit can be minimized and the area of the chip of the device can be reduced.

As described above, according to the present invention, there are provided a semiconductor integrated circuit device enabling the set internal voltage level to be detected even after the device has been decomposed, a method of investigating the cause of a failure of a semiconductor integrated circuit device by using the semiconductor integrated circuit device, a semiconductor integrated circuit device capable of previously testing the operation of an integrated circuit at each set voltage level, a method of testing the operation of a semiconductor integrated circuit device by using the semiconductor integrated circuit device and a semiconductor integrated circuit device which has a circuit for setting the internal voltage level to any one of various levels, with which the size of the circuit can be minimized and which has a small area.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor integrated circuit device comprising:
    a semiconductor chip;
    an integrated circuit provided in said chip;
    an internal voltage generating circuit for generating an internal voltage used in said integrated circuit;
    an internal voltage setting circuit for setting a level of the internal voltage;
    a determining circuit for determining the level of the internal voltage; and
    a changing circuit for changing the level of the internal voltage before said determining circuit determines the level of the internal voltage.

2. A semiconductor integrated circuit device according to claim 1, wherein said integrated circuit includes
    a memory cell array including nonvolatile memory cells,
    a driving circuit for driving control gates of the memory cell,
    an outputting circuit for outputting a data from the memory cells to the outside of said chip,
    an inputting circuit for inputting a data from the outside of said chip to the memory cells, and
    said internal voltage generating circuit supplies the internal voltage to said driving circuit.

3. A semiconductor integrated circuit device according to claim 2, wherein said internal voltage setting circuit includes
    an internal signal generating circuit for generating internal signals in accordance with either of outputs of said determining circuit and said changing circuit,
    a decoding circuit for decoding the internal signals, and
    said internal voltage generating circuit changes the level of the internal voltage in accordance with outputs of said decoding circuit.

4. A semiconductor integrated circuit device according to claim 3, wherein said internal voltage generating circuit includes:
    a boosting circuit for boosting a power supply voltage;
    a voltage limiting circuit for limiting a level of a boosted voltage from said boosting circuit; and
    a voltage switching circuit for switching the level of the internal voltage, said voltage switching circuit switching a level of a limited voltage from said voltage limiting circuit in accordance with the outputs of said decoding circuit.

5. A semiconductor integrated circuit device according to claim 3, wherein said determining circuit includes programming fuses and outputs signals in accordance with a state of the programming fuses, said changing circuit being connected to said inputting circuit and outputting signals in accordance with inputs from said inputting circuit.

6. A semiconductor integrated circuit device according to claim 3, further comprising a level-setting information transmitting circuit for transmitting the internal signals from said internal signal generating circuit to the outside of said chip.

7. A semiconductor integrated circuit device according to claim 6, wherein said level-setting information transmitting circuit includes a multiplexing circuit for multiplexing data from said memory cells and the internal signals from said internal signal generating circuit, said multiplexing circuit supplying either of the internal signals from said internal signal generating circuit or the data from said memory cells to said outputting circuit.

8. A semiconductor device comprising:
    an integrated circuit;
    a test programming circuit for adjusting a level of an internal voltage to be used by the integrated circuit, the test programming circuit generating a first signal representing the level of the internal voltage;

a program circuit for generating a second signal representing the level of the internal voltage;

a voltage setting circuit for generating a third signal according to one of the first signal and the second signal; and a voltage generating circuit for generating the internal voltage in accordance with the third signal.

9. The semiconductor device of claim 8, wherein the voltage setting circuit generates the third signal according to the first signal but not the second signal during a testing process for determining an appropriate level for the internal voltage, and the voltage setting circuit generates the third signal according to the second signal but not the first signal after the testing process is completed.

10. The semiconductor device of claim 8, wherein the voltage generating circuit is configured to receive a power supply voltage, the voltage generating circuit including a boosting circuit for boosting the power supply voltage to generate the internal voltage, the internal voltage being greater than the power supply voltage.

11. The semiconductor device of claim 8, wherein the integrated circuit includes a memory cell array, the internal voltage being used for writing to the memory cell array.

12. The semiconductor device of claim 8, wherein the program circuit includes a plurality of programming fuses, the second signal comprising a plurality of outputs each corresponding to a different one of the plurality of programming fuses.

* * * * *